(12) United States Patent
Sonobe

(10) Patent No.: US 11,927,478 B2
(45) Date of Patent: Mar. 12, 2024

(54) LIGHT DETECTION DEVICE

(71) Applicant: HAMAMATSU PHOTONICS K.K., Hamamatsu (JP)

(72) Inventor: Hironori Sonobe, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 376 days.

(21) Appl. No.: 17/311,763

(22) PCT Filed: Nov. 29, 2019

(86) PCT No.: PCT/JP2019/046909
§ 371 (c)(1),
(2) Date: Jun. 8, 2021

(87) PCT Pub. No.: WO2020/121859
PCT Pub. Date: Jun. 18, 2020

(65) Prior Publication Data
US 2022/0026269 A1 Jan. 27, 2022

(30) Foreign Application Priority Data

Dec. 12, 2018 (JP) ................... 2018-232892
Dec. 12, 2018 (JP) ................... 2018-232895
Sep. 26, 2019 (JP) ................... 2019-175948

(51) Int. Cl.
H01L 31/107 (2006.01)
G01J 1/44 (2006.01)
(Continued)

(52) U.S. Cl.
CPC ............ G01J 1/44 (2013.01); H01L 27/1446 (2013.01); H01L 31/02027 (2013.01);
(Continued)

(58) Field of Classification Search
CPC .......... G01J 1/44; G01J 1/4228; G01J 1/0214; G01J 1/42; G01J 1/02; G01J 2001/444;
(Continued)

(56) References Cited

U.S. PATENT DOCUMENTS 4,181,863 A * 1/1980 Parker ............... H01L 31/02027
250/552
4,247,186 A * 1/1981 Uchidoi .................... G01J 1/44
396/231
(Continued)

FOREIGN PATENT DOCUMENTS

CN 1516362 A 7/2004
CN 200950235 A 9/2007
(Continued)

OTHER PUBLICATIONS

International Preliminary Report on Patentability dated Jun. 24, 2021 for PCT/JP2019/046909.
(Continued)

*Primary Examiner* — Allison Bernstein
*Assistant Examiner* — Margaret B Hayes
(74) *Attorney, Agent, or Firm* — Faegre Drinker Biddle & Reath LLP

(57) ABSTRACT

In a light detection device, the light detection unit includes an APD, a plurality of temperature compensation diodes, and a terminal electrically connecting the APD and the plurality of temperature compensation diodes in parallel with each other. The plurality of temperature compensation diodes is configured to provide temperature compensation for the gain of the APD. The light detection unit has a light detection region and temperature detection regions. The APD is provided in the light detection region. The temperature detection regions are located around the light detection region. The plurality of temperature compensation diodes
(Continued)

are provided in the temperature detection regions. The light detection region is interposed between the temperature detection region and the temperature detection region.

4 Claims, 12 Drawing Sheets

(51) Int. Cl.
  *H01L 27/144* (2006.01)
  *H01L 31/02* (2006.01)
(52) U.S. Cl.
  CPC ...... *H01L 31/107* (2013.01); *G01J 2001/444* (2013.01); *G01J 2001/4466* (2013.01)
(58) Field of Classification Search
  CPC ......... G01J 2001/4466; H01L 27/1446; H01L 27/146; H01L 27/1443; H01L 31/02027; H01L 31/07; H01L 31/02005; H01L 31/035272
  See application file for complete search history.

(56) References Cited

U.S. PATENT DOCUMENTS

| | | | |
|---|---|---|---|
| 4,292,514 | A | 9/1981 | Ohtomo |
| 4,464,048 | A | 8/1984 | Farlow |
| 4,948,989 | A | 8/1990 | Spratt |
| 5,548,112 | A * | 8/1996 | Nakase ................. H01L 31/107 250/214 R |
| 5,578,815 | A | 11/1996 | Nakase et al. |
| 6,313,459 | B1 | 11/2001 | Hoffe et al. |
| 6,504,140 | B1 | 1/2003 | Ueno et al. |
| 8,350,351 | B2 | 1/2013 | Koyama |
| 9,954,124 | B1 | 4/2018 | Kuznetsov |
| 10,064,585 | B2 | 9/2018 | Kimura et al. |
| 11,513,002 | B2 * | 11/2022 | Sonobe ..................... G01J 1/44 |
| 2003/0117121 | A1 | 6/2003 | Prescott |
| 2005/0092896 | A1 | 5/2005 | Ichino |
| 2008/0138092 | A1 | 6/2008 | Nagakubo |
| 2012/0101614 | A1 | 4/2012 | Ghaemi et al. |
| 2015/0177394 | A1 | 6/2015 | Dolinsky et al. |
| 2016/0084964 | A1 | 3/2016 | Kimura et al. |
| 2016/0273959 | A1 | 9/2016 | Wang |
| 2016/0373126 | A1 * | 12/2016 | Kim ..................... H01L 31/024 |
| 2017/0031009 | A1 | 2/2017 | Davidovic et al. |
| 2018/0180473 | A1 | 6/2018 | Clemens et al. |
| 2018/0214057 | A1 | 8/2018 | Schultz et al. |
| 2018/0266881 | A1 | 9/2018 | Fujiwara et al. |
| 2021/0134862 | A1 | 5/2021 | Ishida et al. |
| 2022/0020786 | A1 | 1/2022 | Sonobe |
| 2022/0020806 | A1 | 1/2022 | Sonobe et al. |
| 2022/0026268 | A1 | 1/2022 | Sonobe et al. |
| 2022/0026269 | A1 | 1/2022 | Sonobe |
| 2022/0026270 | A1 | 1/2022 | Sonobe |
| 2022/0037548 | A1 | 2/2022 | Sonobe |
| 2022/0037852 | A1 | 2/2022 | Jung et al. |
| 2023/0083263 | A1 | 3/2023 | Fujiwara et al. |

FOREIGN PATENT DOCUMENTS

| | | |
|---|---|---|
| CN | 200959101 A | 10/2007 |
| CN | 201601136 U | 10/2010 |
| CN | 103728030 A | 4/2014 |
| CN | 103890972 A | 6/2014 |
| CN | 103907206 A | 7/2014 |
| DE | 102013100696 B3 | 11/2013 |
| EP | 1006591 A2 | 6/2000 |
| EP | 2040308 A1 | 3/2009 |
| EP | 2755235 A1 | 7/2014 |
| GB | 1231906 | 5/1971 |
| GB | 1503088 A | 3/1978 |
| GB | 1532262 | 11/1978 |
| GB | 1535824 | 12/1978 |
| JP | S50-062389 A | 5/1975 |
| JP | S53-041280 A | 4/1978 |
| JP | S55-006924 U | 1/1980 |
| JP | S55-127082 A | 10/1980 |
| JP | S60-178673 A | 9/1985 |
| JP | S60-180347 A | 9/1985 |
| JP | S60-211886 A | 10/1985 |
| JP | S61-038975 U | 3/1986 |
| JP | S61-289677 A | 12/1986 |
| JP | S62-239727 A | 10/1987 |
| JP | S62-279671 A | 12/1987 |
| JP | S64-013768 A | 1/1989 |
| JP | H01-118714 A | 5/1989 |
| JP | H03-021082 A | 1/1991 |
| JP | H03-278482 A | 12/1991 |
| JP | H04-111477 A | 4/1992 |
| JP | H04-256376 A | 9/1992 |
| JP | H05-235396 A | 9/1993 |
| JP | H05-275668 A | 10/1993 |
| JP | H06-224463 A | 8/1994 |
| JP | H07-027607 A | 1/1995 |
| JP | H7-063854 | 3/1995 |
| JP | H7-263653 A | 10/1995 |
| JP | H08-207281 A | 8/1996 |
| JP | H10-247717 A | 9/1998 |
| JP | H11-275755 A | 10/1999 |
| JP | 2002-204149 A | 7/2002 |
| JP | 2004-281488 A | 10/2004 |
| JP | 2004-289206 A | 10/2004 |
| JP | 2004-303878 A | 10/2004 |
| JP | 2006-080416 A | 3/2006 |
| JP | 2007-266251 A | 10/2007 |
| JP | 2007-281509 A | 10/2007 |
| JP | 2008-148068 A | 6/2008 |
| JP | 2009-038157 A | 2/2009 |
| JP | 2013-164263 A | 8/2013 |
| JP | 2014-142340 A | 8/2014 |
| JP | 2018-174308 A | 11/2018 |
| SE | 417145 B | 2/1981 |
| TW | 201743459 A | 12/2017 |

OTHER PUBLICATIONS

International Preliminary Report on Patentability dated Jun. 24, 2021 for PCT/JP2019/046900.
International Preliminary Report on Patentability dated Jun. 24, 2021 for PCT/JP2019/046901.
International Preliminary Report on Patentability dated Jun. 24, 2021 for PCT/JP2019/046881.
International Preliminary Report on Patentability dated Jun. 24, 2021 for PCT/JP2019/046880.
International Preliminary Report on Patentability dated Jun. 24, 2021 for PCT/JP2019/046907.
International Preliminary Report on Patentability dated Jun. 24, 2021 for PCT/JP2019/046908.

* cited by examiner

LIGHT DETECTION DEVICE

TECHNICAL FIELD

The present invention relates to a light detection device.

BACKGROUND ART

A configuration is known in which a bias voltage applied to an avalanche photodiode is controlled in order to provide stable light detection with respect to temperature (for example, Patent Literature 1). In Patent Literature 1, a voltage corresponding to the breakdown voltage of a temperature compensation diode is applied to the avalanche photodiode as a bias voltage. Hereinafter, in this specification, the "avalanche photodiode" will be referred to as an "APD".

CITATION LIST

Patent Literature

Patent Literature 1: Japanese Unexamined Patent Publication No. H07-27607

SUMMARY OF INVENTION

Technical Problem

In a light detection device, it is excepted to obtain a desired gain in a stable manner with respect to temperature in the APD. However, the gain of the APD changes according to the change in the bias voltage applied to the APD. Even if a constant bias voltage is applied to the APD, the gain of the APD changes as the ambient temperature changes. Therefore, maintaining the gain of the APD constant needs to change the bias voltage applied to the APD according to the ambient temperature.

When the difference voltage between the breakdown voltage of the APD and the bias voltage applied to the APD is controlled to be constant, the change in the gain of the APD is small even if the ambient temperature changes. Therefore, in order to perform stable light detection with respect to temperature, a configuration can be considered in which a voltage corresponding to the breakdown voltage of the temperature compensation diode is applied to the APD as a bias voltage. In this configuration, the breakdown voltage of the temperature compensation diode changes together with the breakdown voltage of the APD according to the change in ambient temperature. Therefore, the difference voltage between the breakdown voltage of the APD and the bias voltage applied to the APD can be controlled to be constant.

However, in the above configuration, when the temperature near the temperature compensation diode locally increases, the breakdown voltage of the temperature compensation diode changes more than the breakdown voltage of the APD. In this case, since the bias voltage applied to the APD is a voltage corresponding to the breakdown voltage applied to the temperature compensation diode, the stability of the gain of the APD with respect to the temperature may be adversely affected. If the breakdown voltage of the temperature compensation diode becomes higher than the breakdown voltage of the APD, the APD breaks down. In this case, the light detection device may be damaged.

An object of one aspect of the present invention is to provide a light detection device with improved resistance to local temperature changes.

Solution to Problem

A light detection device according to one aspect of the present invention includes a light detection unit. The light detection unit includes at least one APD, a plurality of temperature compensation diodes, and a terminal electrically connecting the at least one APD and the plurality of temperature compensation diodes in parallel with each other. The plurality of temperature compensation diodes is configured to provide temperature compensation for a gain of the at least one APD. The light detection unit has a light detection region and first and second temperature detection regions. At least one APD is provided in the light detection region. The first and second temperature detection regions are located around the light detection region. At least one of the plurality of temperature compensation diodes is provided in the first temperature detection region. The rest of the plurality of temperature compensation diodes excluding the at least one temperature compensation diode is provided in the second temperature detection region. The light detection region is interposed between the first temperature detection region and the second temperature detection region.

In the one aspect described above, the APD and the plurality of temperature compensation diodes are electrically connected to the terminal in parallel with each other. In this configuration, when any one of the plurality of temperature compensation diodes is in a breakdown state, a voltage corresponding to the breakdown voltage of the temperature compensation diode in the breakdown state is applied to the APD as a bias voltage. The first temperature detection region and the second temperature detection region where the plurality of temperature compensation diodes are provided are located with the light detection region interposed therebetween. Therefore, even if the temperature rises locally in the vicinity of the first temperature detection region, the temperature compensation diodes provided in the second temperature detection region can operate normally. That is, the light detection device has improved resistance to local temperature changes.

In the one aspect described above, the plurality of temperature compensation diodes may include first and second temperature compensation diodes having a common breakdown voltage. The first temperature compensation diode may be provided in the first temperature detection region. The second temperature compensation diode may be provided in the second temperature detection region. In this case, even if the temperature is locally high in the vicinity of the first temperature detection region and the first temperature compensation diode does not function normally, the second temperature compensation diode provided in the second temperature detection region can operate normally. Therefore, even if the temperature changes locally, a stable bias voltage can be applied to the APD. For this reason, a desired gain can be stably obtained in the APD.

In the one aspect described above, the plurality of temperature compensation diodes may include third and fourth temperature compensation diodes having breakdown voltages different from those of the first and second temperature compensation diodes. The third and fourth temperature compensation diodes may have a common breakdown voltage. The third temperature compensation diode may be provided in the first temperature detection region. The fourth temperature compensation diode may be provided in the second temperature detection region. In this case, the voltage applied to the APD as a bias voltage can be switched between the breakdown voltage of the third and fourth temperature compensation diodes and the breakdown voltage of the first and second temperature compensation diodes. For this reason, in the APD, even if the temperature is locally high in the vicinity of the first temperature detection region and the first or third temperature compensation diode does not function normally, the second or fourth temperature compensation diode provided in the second temperature detection region can operate normally. Therefore, even if the temperature changes locally, a desired bias voltage that is stable can be applied to the APD. For this reason, a gain desired according to the situation can be stably obtained in the APD.

In the one aspect described above, the light detection unit may include a plurality of APDs as at least one APD. The plurality of APDs may be provided in the light detection region. In this case, a temperature difference is likely to occur around the light detection region in which the APDs are provided. In the light detection device, since the first temperature detection region and the second temperature detection region are located with the light detection region interposed therebetween, the resistance to local temperature changes is improved.

Advantageous Effects of Invention

According to one aspect of the present invention, it is possible to provide a light detection device with improved resistance to local temperature changes.

DESCRIPTION OF EMBODIMENTS

Figure 1:
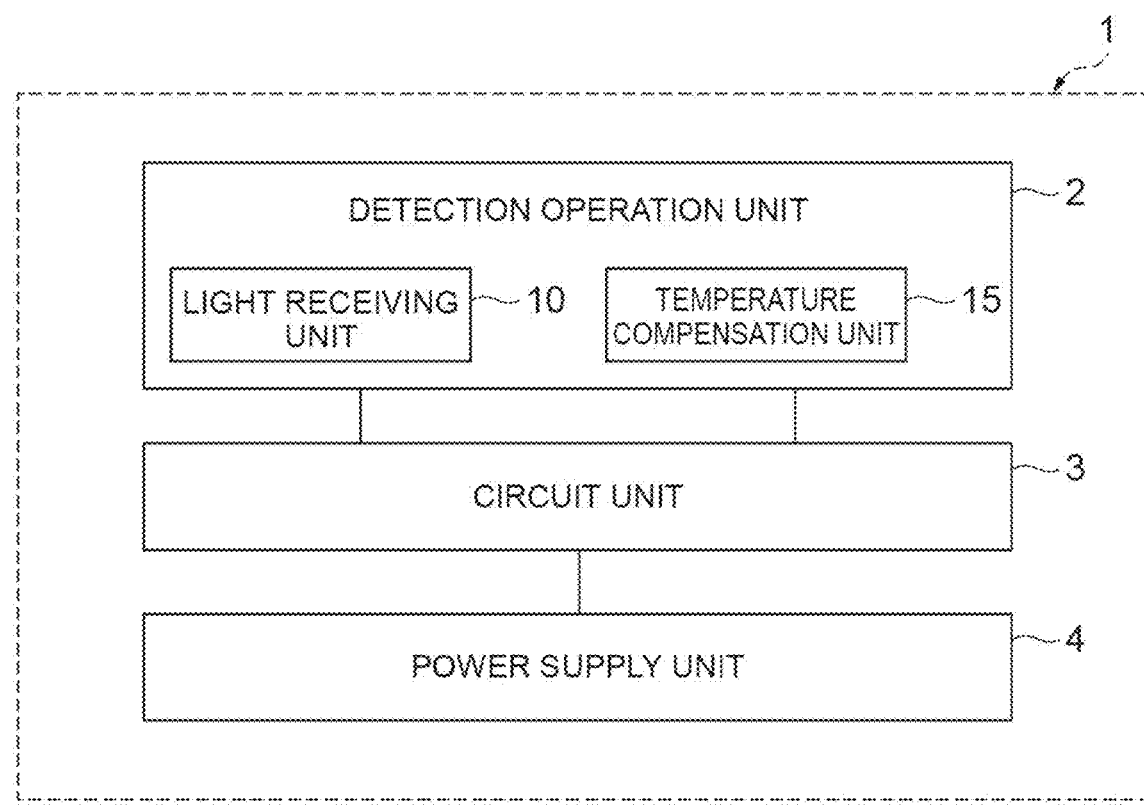
FIG. 1 is a block diagram of a light detection device according to the present embodiment.

Hereinafter, embodiments of the present invention will be described in detail with reference to the accompanying diagrams. In addition, in the description, the same elements or elements having the same function are denoted by the same reference numerals, and repeated descriptions thereof will be omitted.

First, an outline of a light detection device according to the present embodiment will be described with reference to FIG. 1. FIG. 1 is a block diagram of a light detection device. As illustrated in FIG. 1, a light detection device 1 includes a detection operation unit 2, a circuit unit 3, and a power supply unit 4.

The detection operation unit 2 includes a light receiving unit 10 and a temperature compensation unit 15. The light receiving unit 10 includes at least one APD. In the present embodiment, the APD of the light receiving unit 10 is an avalanche photodiode arranged to operate in linear mode. The temperature compensation unit 15 is configured to provide temperature compensation for the gain in the APD of the light receiving unit 10. The temperature compensation unit 15 is configured to control a bias voltage applied to the APD of the light receiving unit 10. The temperature compensation unit 15 includes a plurality of temperature compensation diodes configured to provide temperature compensation for the gain of the APD.

The circuit unit 3 applies a voltage to the light receiving unit 10 and the temperature compensation unit 15 of the detection operation unit 2. The circuit unit 3 is electrically connected to each electrode of the APD of the light receiving unit 10 and the temperature compensation diode of the temperature compensation unit 15. In the present embodiment, the circuit unit 3 applies, to the APD of the light receiving unit 10, a voltage which causes the temperature compensation diode included in the temperature compensation unit 15 to break down.

The power supply unit 4 generates an electromotive force for operating the detection operation unit 2. The power supply unit 4 applies, through the circuit unit 3, a potential to the APD of the light receiving unit 10 and the temperature compensation diode of the temperature compensation unit 15 in the detection operation unit 2. The power supply unit 4 causes the temperature compensation diode included in the temperature compensation unit 15 to break down.

By applying a breakdown voltage to any one of the temperature compensation diodes of the temperature compensation unit 15, a voltage corresponding to the breakdown voltage is applied to the APD of the light receiving unit 10 as a bias voltage. The temperature compensation diode and the APD have the same temperature characteristics with respect to the relationship between the gain and the bias voltage. In this case, when the ambient temperature changes, the breakdown voltage applied to the temperature compensation diode changes. Due to the change in the breakdown voltage applied to the temperature compensation diode, the bias voltage applied to the APD also changes according to the ambient temperature so that the gain of the APD is maintained. That is, the temperature compensation unit 15 provides temperature compensation for the gain in the APD of the light receiving unit 10.

Figure 2:
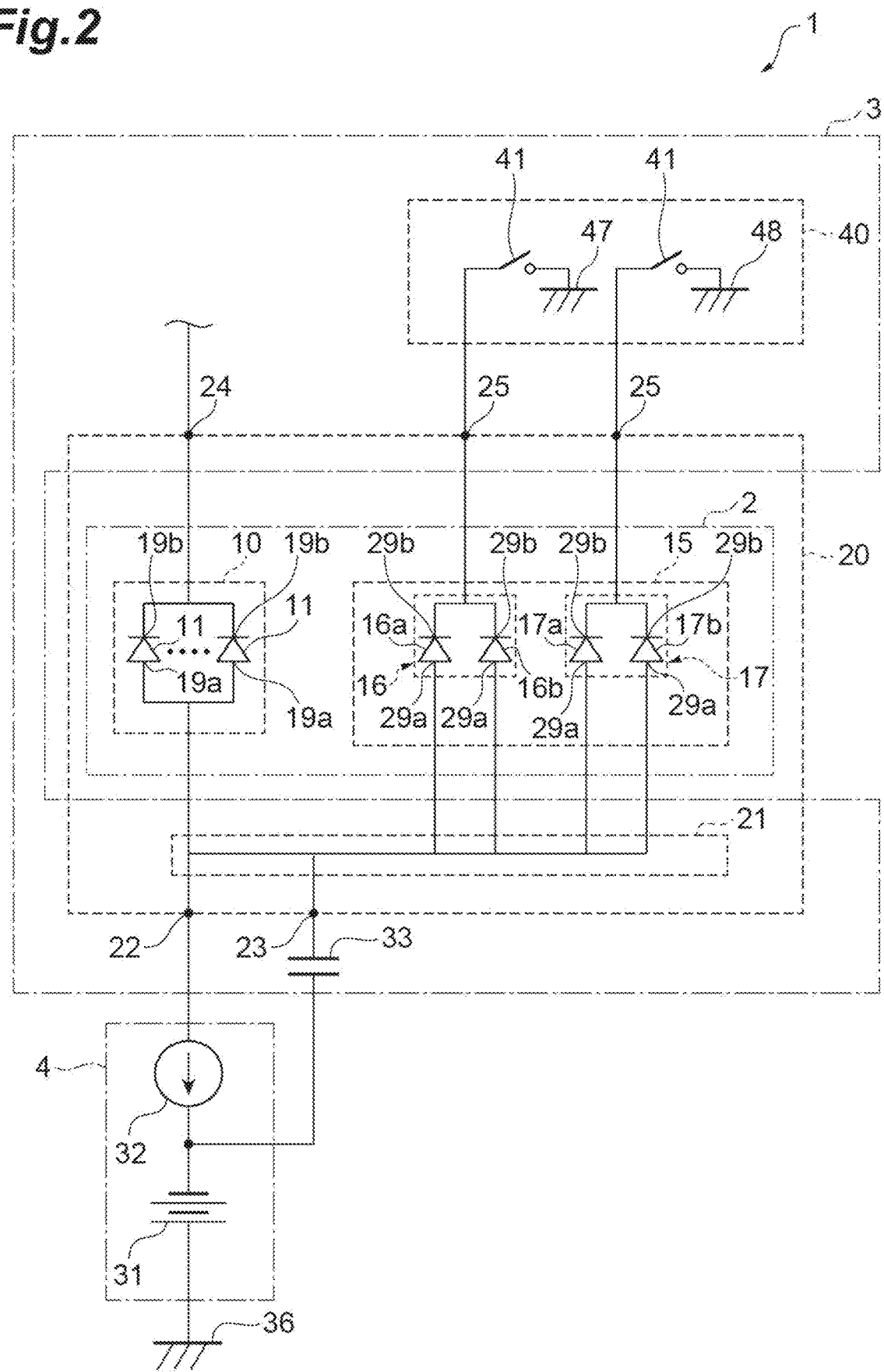
FIG. 2 is a schematic configuration diagram of the light detection device.

Next, an example of the physical configuration of the light detection device 1 will be described in more detail with reference to FIG. 2. The light detection device 1 includes a light detection unit 20, an electromotive force generation unit 31, a current limiting unit 32, a bias voltage stabilization unit 33, and a setting unit 40. FIG. 2 is a schematic configuration diagram of a light detection device. The light detection unit 20 includes the light receiving unit 10 and the temperature compensation unit 15 described above. The electromotive force generation unit 31 generates an electromotive force for operating the light detection unit 20. The current limiting unit 32 limits a current flowing through the light detection unit 20. The bias voltage stabilization unit 33 enables a current output equal to or greater than an upper limit value limited by the current limiting unit 32. The setting unit 40 controls the operation of the light detection unit 20. A part of the light detection unit 20 is included in the detection operation unit 2. A part of the light detection unit 20, the bias voltage stabilization unit 33, and the setting unit 40 are included in the circuit unit 3. The electromotive force generation unit 31 and the current limiting unit 32 are included in the power supply unit 4.

As illustrated in FIG. 2, the light detection unit 20 includes, in addition to the light receiving unit 10 and the temperature compensation unit 15, a wiring unit 21 for electrically connecting the temperature compensation unit 15 and the light receiving unit 10 to each other and a plurality of terminals 22, 23, 24, and 25. For example, the terminal 22 is a first terminal, and the plurality of terminals 25 are a plurality of second terminals. In this specification, "electrically connects" and "electrically connected" also include a configuration in which the path is temporarily cut by a switch or the like. The light receiving unit 10 and the temperature compensation unit 15 are included in the detection operation unit 2. The wiring unit 21 and the plurality of terminals 22, 23, 24, and 25 are included in the circuit unit 3.

The plurality of temperature compensation diodes of the temperature compensation unit 15 are divided into a plurality of groups according to a difference in voltage at which a breakdown state occurs under the same ambient temperature. In the present embodiment, the plurality of temperature compensation diodes of the temperature compensation unit 15 are divided into two groups 16 and 17. Each of the groups 16 and 17 includes at least one temperature compensation diode. The temperature compensation diodes in the same group break down at the same voltage under the same ambient temperature. "Same voltage" means manufacturing with the intention of causing a breakdown state at the same voltage. Therefore, the range of manufacturing error based on the above intention is also included. Hereinafter, a voltage applied to the corresponding temperature compensation diode when the temperature compensation diodes 16a, 16b, 17a, and 17b break down and a voltage applied to the APD 11 when the APD 11 breaks down are referred to as "breakdown voltages". In the following description, when comparing breakdown voltages, it is assumed that breakdown voltages at the same ambient temperature are compared with each other.

In the present embodiment, as illustrated in FIG. 2, the temperature compensation unit 15 includes the four temperature compensation diodes 16a, 16b, 17a, and 17b as a plurality of temperature compensation diodes. The temperature compensation diodes 16a and 16b are included in the group 16, and the temperature compensation diodes 17a and 17b are included in the group 17. In the present embodiment, as illustrated in FIG. 2, the light receiving unit 10 includes a plurality of APDs 11. The plurality of APDs 11 and the plurality of temperature compensation diodes 16a, 16b, 17a, and 17b are included in the detection operation unit 2. For example, the temperature compensation diode 16a is a first temperature compensation diode, and the temperature compensation diode 16b is a second temperature compensation diode. For example, the temperature compensation diode 17a is a third temperature compensation diode, and the temperature compensation diode 17b is a fourth temperature compensation diode.

The plurality of APDs 11 have a common breakdown voltage. The temperature compensation diodes 16a and 16b have a common breakdown voltage. The temperature compensation diodes 17a and 17b have a common breakdown voltage. The temperature compensation diodes 16a and 16b of the group 16 and the temperature compensation diodes 17a and 17b of the group 17 have mutually different breakdown voltages. The temperature compensation diode 16a and the temperature compensation diode 16b have a breakdown voltage higher than that of the temperature compensation diode 17a and the temperature compensation diode 17b. The breakdown voltage of each of the temperature compensation diodes 16a, 16b, 17a, and 17b is lower than the breakdown voltage of any of the plurality of APDs 11.

Each APD 11 includes a pair of electrodes 19a and 19b. Each of the temperature compensation diodes 16a, 16b, 17a, and 17b includes a pair of electrodes 29a and 29b. The electrodes 19a of the plurality of APDs 11 are connected to each other. The electrodes 19b of the plurality of APDs 11 are connected to each other. The electrodes 19b of the plurality of APDs 11 and the electrodes 29a of the plurality of temperature compensation diodes 16a, 16b, 17a, and 17b are connected to each other.

The electrode 29b of the temperature compensation diode 16a and the electrode 29b of the temperature compensation diode 16b are connected to each other. The electrode 29b of the temperature compensation diode 17a and the electrode 29b of the temperature compensation diode 17b are connected to each other. That is, the electrodes 29b of the temperature compensation diodes included in the same group are connected to each other.

The wiring unit 21 connects the electrode 19a of each APD 11 and the electrode 29a of each of the temperature compensation diodes 16a, 16b, 17a, and 17b to both the terminals 22 and 23 in parallel with each other. The wiring unit 21 applies a voltage corresponding to the breakdown voltage of each of the temperature compensation diodes 16a, 16b, 17a, and 17b to each APD 11 as a bias voltage.

The terminal 22 is electrically connected to the electrode 19a of each APD 11, the electrode 29a of each of the temperature compensation diodes 16a, 16b, 17a, and 17b, and the current limiting unit 32 of the power supply unit 4. That is, the terminal 22 electrically connects the electrode 19a of each APD 11 and the electrode 29a of each of the temperature compensation diodes 16a, 16b, 17a, and 17b in parallel with each other. The terminal 23 is electrically connected to the electrode 19a of each APD 11, the electrode 29a of each of the temperature compensation diodes 16a, 16b, 17a, and 17b, and the bias voltage stabilization unit 33. The terminal 24 is electrically connected to the electrode 19b of each APD 11 and a signal reading circuit (not illustrated). The plurality of terminals 25 are electrically connected to the setting unit 40 and the electrodes 29b of the temperature compensation diodes 16a, 16b, 17a, and 17b. The respective terminals 25 are connected to the electrodes 29b of the temperature compensation diodes 16a, 16b, 17a, and 17b different from each other. In the present embodiment, the electrode 19a is the anode of the APD 11, and the electrode 19b is the cathode of the APD 11. The electrode 29a is the anode of each of the temperature compensation diodes 16a, 16b, 17a, and 17b, and the electrode 29b is the cathode of each of the temperature compensation diodes 16a, 16b, 17a, and 17b.

The electromotive force generation unit 31 and the current limiting unit 32 serving as the power supply unit 4 apply a voltage to the light detection unit 20. The electromotive force generation unit 31 and the current limiting unit 32 are electrically connected to the terminal 22. In the present embodiment, the positive electrode of the electromotive force generation unit 31 is connected to a ground 36, and the negative electrode of the electromotive force generation unit 31 is connected to the terminal 22 through the current limiting unit 32.

The bias voltage stabilization unit 33 increases the upper limit value of the detection signal output from the APD 11. The bias voltage stabilization unit 33 is connected to the light detection unit 20 and the electromotive force generation unit 31 in parallel with the current limiting unit 32. The bias voltage stabilization unit 33 is, for example, a capacitor. In the present embodiment, one electrode of the capacitor is connected to the negative electrode of the electromotive force generation unit 31, and the other electrode is connected to the terminal 23. When a pulse signal output from the APD 11 due to incidence of light is detected, an output having a strength equal to or greater than the current value limited by the current limiting unit 32 is obtained according to the capacitance of the capacitor.

The setting unit 40 is configured to set the temperature compensation unit 15 according to the gain to be set in the APD 11. The setting unit 40 selects a group to be operated from the groups 16 and 17 of the plurality of temperature compensation diodes 16a, 16b, 17a and 17b. In other words, the setting unit 40 sets a group of temperature compensation diodes to be used for controlling the bias voltage from the groups 16 and 17 of the plurality of temperature compensation diodes 16a, 16b, 17a and 17b. The setting unit 40 sets a temperature compensation diode to be operated by controlling the current application states of the plurality of temperature compensation diodes 16a, 16b, 17a, and 17b.

The setting unit 40 includes at least one switch 41. At least one switch 41 is connected to a corresponding terminal 25. In the present embodiment, the setting unit 40 includes two switches 41. One switch 41 is electrically connected to the temperature compensation diodes 16a and 16b of the group 16 through the corresponding terminal 25. The other switch 41 is electrically connected to the temperature compensation diodes 17a and 17b of the group 17 through the corresponding terminal 25. The switches 41 is configured to switch between a state capable of electrically energizing the corresponding temperature compensation diodes 16a, 16b, 17a, and 17b and a state incapable of electrically energizing the corresponding temperature compensation diodes 16a, 16b, 17a, and 17b. The setting unit 40 controls ON/OFF of the switch 41.

In the present embodiment, the light detection unit 20 includes two terminals 25. The temperature compensation diodes 16a and 16b of the group 16 are connected to the same one terminal 25. The temperature compensation diodes 17a and 17b of the group 17 are connected to the same one terminal 25. The terminal 25 connected to the temperature compensation diodes 16a and 16b is connected to a ground 47 through the switch 41. The terminal 25 connected to the temperature compensation diodes 17a and 17b is connected to a ground 48 through the switch 41. As a modification example of the present embodiment, the terminal 25 connected to the temperature compensation diodes 16a and 16b may be directly connected to the ground.

Figure 3:
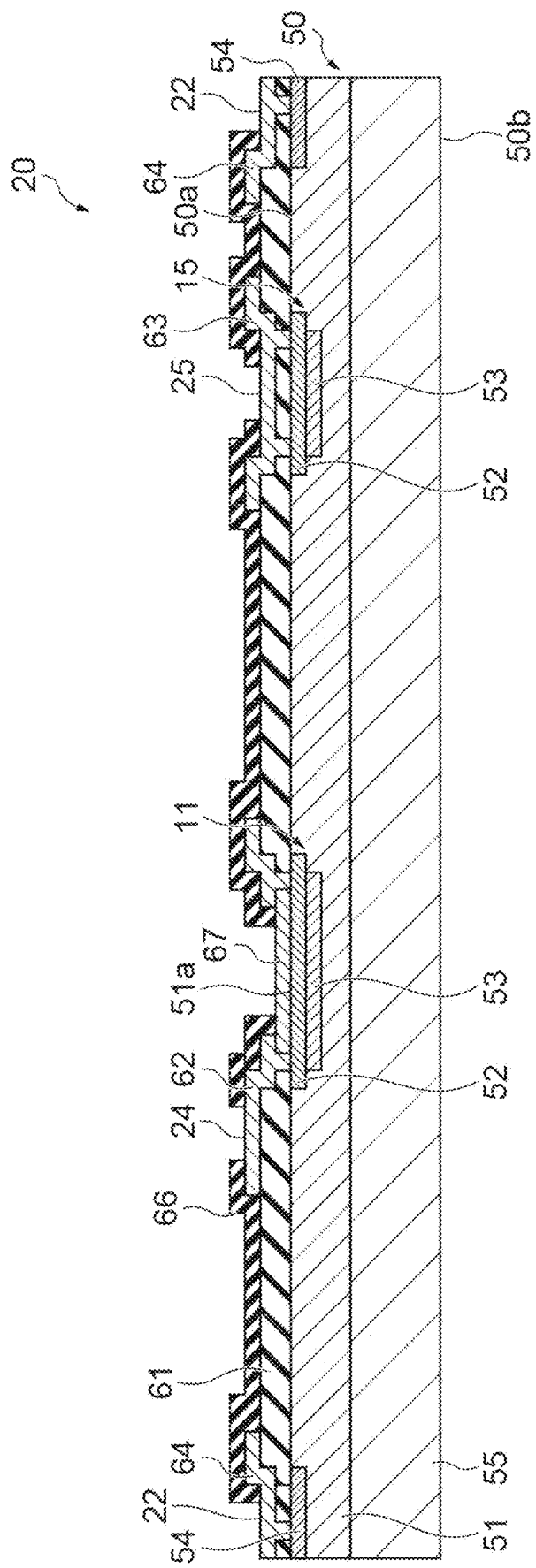
FIG. 3 is a schematic cross-sectional view of a light detection unit.

Next, the structure of the light detection unit 20 in the light detection device 1 will be described in detail with reference to FIG. 3. FIG. 3 is a schematic cross-sectional view of a light detection unit. In FIG. 3, only one APD 11 is illustrated as the light receiving unit 10. In FIG. 3, only one of the temperature compensation diodes 16a, 16b, 17a, and 17b is illustrated as the temperature compensation unit 15. In the present embodiment, as illustrated in FIG. 3, the light detection unit 20 is an optical member including a semiconductor substrate 50. The semiconductor substrate 50 has main surfaces 50a and 50b facing each other. The APD 11 and the temperature compensation diodes 16a, 16b, 17a, and 17b are formed on the semiconductor substrate 50 so as to be spaced apart from each other when viewed from a direction perpendicular to the main surface 50a. The APD 11 has a light incidence surface 51a on the main surface 50a side. The temperature compensation diodes 16a, 16b, 17a, and 17b are light-shielded APDs.

The semiconductor substrate 50 includes a semiconductor region 51 and semiconductor layers 52, 53, 54, and 55. Each of the APD 11 and the temperature compensation diodes 16a, 16b, 17a, and 17b includes the semiconductor region 51 and the semiconductor layers 52, 53, and 55.

The semiconductor region 51 and the semiconductor layers 53, 54, and 55 are the first conductive type, and the semiconductor layer 52 is the second conductive type. Semiconductor impurities are added by, for example, a diffusion method or an ion implantation method. In the present embodiment, the first conductive type is P type and the second conductive type is N type. When the semiconductor substrate 50 is an Si-based substrate, a Group 13 element such as B is used as the P-type impurity, and a Group 15 element such as N, P, or As is used as the N-type impurity.

The semiconductor region 51 is located on the main surface 50a side of the semiconductor substrate 50. The semiconductor region 51 forms a part of the main surface 50a. The semiconductor region 51 is, for example, $P^-$ type.

The semiconductor layer 52 forms a part of the main surface 50a. The semiconductor layer 52 is surrounded by the semiconductor region 51 so as to be in contact with the semiconductor region 51 when viewed from the direction perpendicular to the main surface 50a. The semiconductor layer 52 is, for example, $N^+$ type. In the present embodiment, the semiconductor layer 52 forms a cathode in each of the APD 11 and the temperature compensation diodes 16a, 16b, 17a, and 17b.

The semiconductor layer 53 is located between the semiconductor region 51 and the semiconductor layer 52. In other words, the semiconductor layer 53 is in contact with the semiconductor layer 52 on the main surface 50a side and is in contact with the semiconductor region 51 on the main surface 50b side. The semiconductor layer 53 has a higher impurity concentration than the semiconductor region 51. The semiconductor layer 53 is, for example, P type. In the present embodiment, the impurity concentration of the semiconductor layer 53 of each of the temperature compensation diodes 16a, 16b, 17a, and 17b is higher than the impurity concentration of the semiconductor layer 53 of the APD 11. The semiconductor layer 53 forms an avalanche region in each of the APD 11 and the temperature compensation diodes 16a, 16b, 17a, and 17b. The impurity concentration of the semiconductor layer 53 of each of the temperature compensation diodes 17a and 17b of the group 17 is higher than the impurity concentration of the semiconductor layer 53 of each of the temperature compensation diodes 16a and 16b of the group 16.

The semiconductor layer 54 forms a part of the main surface 50a. The semiconductor layer 54 is surrounded by the semiconductor region 51 so as to be in contact with the semiconductor region 51 when viewed from the direction perpendicular to the main surface 50a. In the present embodiment, the semiconductor layer 54 has a higher impurity concentration than the semiconductor region 51 and the semiconductor layer 53. The semiconductor layer 54 is, for example, P+ type. The semiconductor layer 54 is connected to the semiconductor layer 55 at a portion that is not illustrated. The semiconductor layer 54 forms an anode of the light detection device 1. The semiconductor layer 54 forms, for example, anodes of the APD 11 and the temperature compensation diodes 16a, 16b, 17a, and 17b.

The semiconductor layer 55 is located closer to the main surface 50b of the semiconductor substrate 50 than the semiconductor region 51. The semiconductor layer 55 forms the entire main surface 50b. The semiconductor layer 55 is in contact with the semiconductor region 51 on the main surface 50a side. In the present embodiment, the semiconductor layer 55 has a higher impurity concentration than the semiconductor region 51 and the semiconductor layer 53. The semiconductor layer 55 is, for example, P+ type. The semiconductor layer 55 forms an anode of the light detection device 1. The semiconductor layer 55 forms, for example, anodes of the APD 11 and the temperature compensation diodes 16a, 16b, 17a, and 17b.

The light detection device 1 further includes an insulating film 61, electrodes 62, 63, and 64, a passivation film 66, and an antireflection film 67 that are provided on the main surface 50a of the semiconductor substrate 50. The insulating film 61 is stacked on the main surface 50a of the semiconductor substrate 50. The insulating film 61 is, for example, a silicon oxide film. Each of the electrodes 62, 63, and 64 is disposed on the insulating film 61. The passivation film 66 is stacked on the insulating film 61 and the electrodes 62, 63, and 64. The antireflection film 67 is stacked on the main surface 50a of the semiconductor substrate 50.

The electrode 62 penetrates the insulating film 61 to be connected to the semiconductor layer 52 of the APD 11. A part of the electrode 62 is exposed from the passivation film 66 to form the terminal 24 of the APD 11. The electrode 62 outputs a signal from the APD 11 at the terminal 24.

The electrode 63 penetrates the insulating film 61 to be connected to the semiconductor layer 52 of each of the temperature compensation diodes 16a, 16b, 17a, and 17b. A part of the electrode 63 is exposed from the passivation film 66 to form the terminal 25 of each of the temperature compensation diodes 16a, 16b, 17a, and 17b.

The electrode 64 penetrates the insulating film 61 to be connected to the semiconductor layer 54. That is, the electrode 64 is connected to the APD 11 and the temperature compensation diodes 16a, 16b, 17a, and 17b. In other words, the APD 11 and the temperature compensation diodes 16a, 16b, 17a, and 17b are connected to the electrode 64 in parallel with each other. A part of the electrode 64 is exposed from the passivation film 66 to form, for example, the terminal 22.

In the present embodiment, the terminal 24 is a pad electrode for the cathode of the APD 11. The terminal 25 is a pad electrode for the cathode of each of the temperature compensation diodes 16a, 16b, 17a, and 17b. The terminal 22 is a pad electrode for the anode of each of the APD 11 and the temperature compensation diodes 16a, 16b, 17a, and 17b.

The APD 11 and the temperature compensation diodes 16a, 16b, 17a, and 17b are connected to the terminal 22 in parallel with each other. When a reverse bias is applied to the APD 11 and the temperature compensation diodes 16a, 16b, 17a, and 17b, a positive voltage is applied to the pad electrode for the cathode, and a negative voltage is applied to the pad electrode for the anode.

The antireflection film 67 is stacked on the semiconductor layer 52 of the APD 11. A part of the antireflection film 67 is exposed from the passivation film 66. Therefore, light transmitted through the antireflection film 67 can enter the semiconductor layer 52 of the APD 11. The semiconductor layer 52 of each of the temperature compensation diodes 16a, 16b, 17a, and 17b is covered with the insulating film 61 and is shielded from light.

Figure 4:
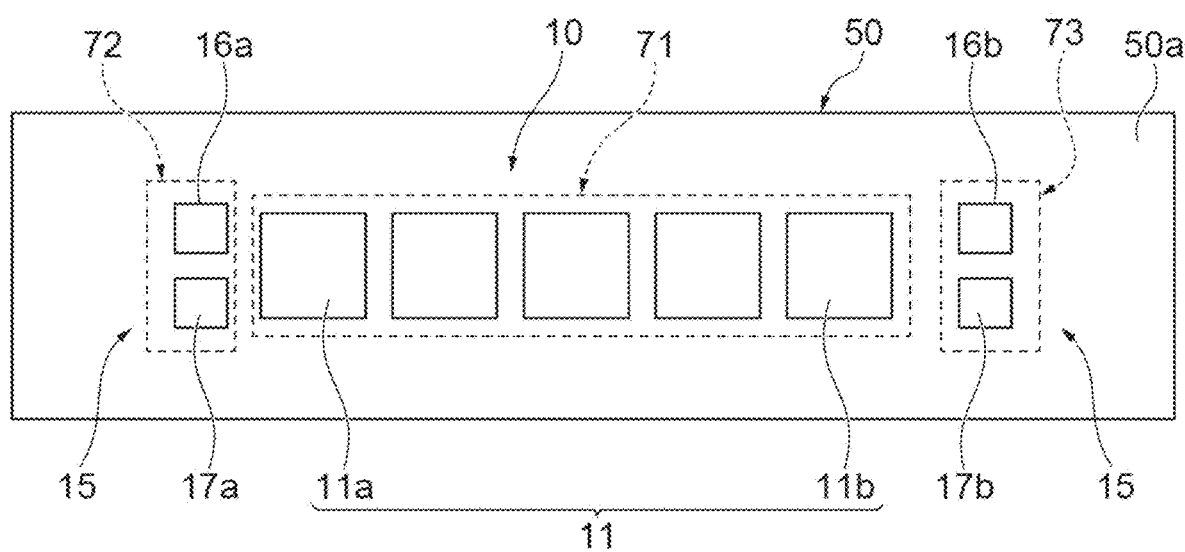
FIG. 4 is a schematic plan view of a semiconductor substrate.

Next, the positional relationship between the APD 11 of the light receiving unit 10 and the temperature compensation diodes 16a, 16b, 17a, and 17b of the temperature compensation unit 15 will be described with reference to FIG. 4. FIG. 4 is a schematic plan view of the semiconductor substrate 50. As illustrated in FIG. 4, the light detection unit 20 has a light detection region 71 where the light receiving unit 10 is provided and a plurality of temperature detection regions 72 and 73 where the temperature compensation unit 15 is provided. The temperature detection regions 72 and 73 are located around the light detection region 71. The light detection region 71 is interposed between the temperature detection region 72 and the temperature detection region 73. In other words, the light detection region 71 is located between the temperature detection region 72 and the temperature detection region 73. For example, the temperature detection region 72 is a first temperature detection region, and the temperature detection region 73 is a second temperature detection region.

At least one APD 11 is provided in the light detection region 71. In the present embodiment, the light receiving unit 10 includes five square APDs 11 as a plurality of APDs 11. As the APDs 11, four or less APDs may be included, or six or more APDs may be included. In the present embodiment, a plurality of APDs 11 are arranged in a row in the light detection region 71. The APD 11a is located at one end of the row, and the APD 11b is located at the other end.

At least one of the plurality of temperature compensation diodes 16a, 16b, 17a, and 17b is provided in the temperature detection region 72. The rest of the plurality of temperature compensation diodes 16a, 16b, 17a, and 17b provided in the temperature detection region 72 are provided in the temperature detection region 73. In the present embodiment, the temperature compensation diodes 16a and 17a are provided in the temperature detection region 72. The temperature compensation diodes 16b and 17b are provided in the temperature detection region 73. That is, temperature compensation diodes of different groups 16 and 17 are provided in the temperature detection regions 72 and 73. As a modification example of the present embodiment, a plurality of temperature compensation diodes of the temperature compensation unit 15 may include three or more groups of temperature compensation diodes having mutually different breakdown voltages, and the temperature compensation diodes of the three or more different groups may be provided in the respective temperature detection regions 72 and 73.

In the present embodiment, the temperature detection regions 72 and 73 are located along the arrangement direction of the plurality of APDs 11. The temperature detection region 72 is closest to the APD 11a among the plurality of APDs 11. The temperature detection region 73 is closest to the APD 11b among the plurality of APDs 11. The temperature compensation diodes 16a and 17a are arranged in a direction crossing the arrangement direction of the plurality of APDs 11 when viewed from the direction perpendicular to the main surface 50a. The temperature compensation diodes 16b and 17b are arranged in a direction crossing the arrangement direction of the plurality of APDs 11 when viewed from the direction perpendicular to the main surface 50a.

Next, the temperature compensation unit 15 will be described in more detail. Each of the temperature compensation diodes 16a, 16b, 17a, and 17b of the temperature compensation unit 15 and the APD 11 have the same temperature characteristics with respect to the relationship between the gain and the bias voltage. In the light detection device 1, a voltage corresponding to the breakdown voltage of each of the temperature compensation diodes 16a, 16b, 17a, and 17b is applied to the APD 11 as a bias voltage.

The temperature compensation unit 15 is configured to control the bias voltage so that the difference voltage between the breakdown voltage of the APD 11 and the bias voltage applied to the APD 11 becomes constant. The difference voltage is determined as follows.

Assuming that the bias voltage applied to the APD is "$V_r$" and the gain of the APD to which the bias voltage is applied is "M", the following equation is satisfied.

[Equation 1]

$$\frac{1}{M} \times \frac{dM}{dV_r} = a \times M + b \quad (1)$$

Figure 5:
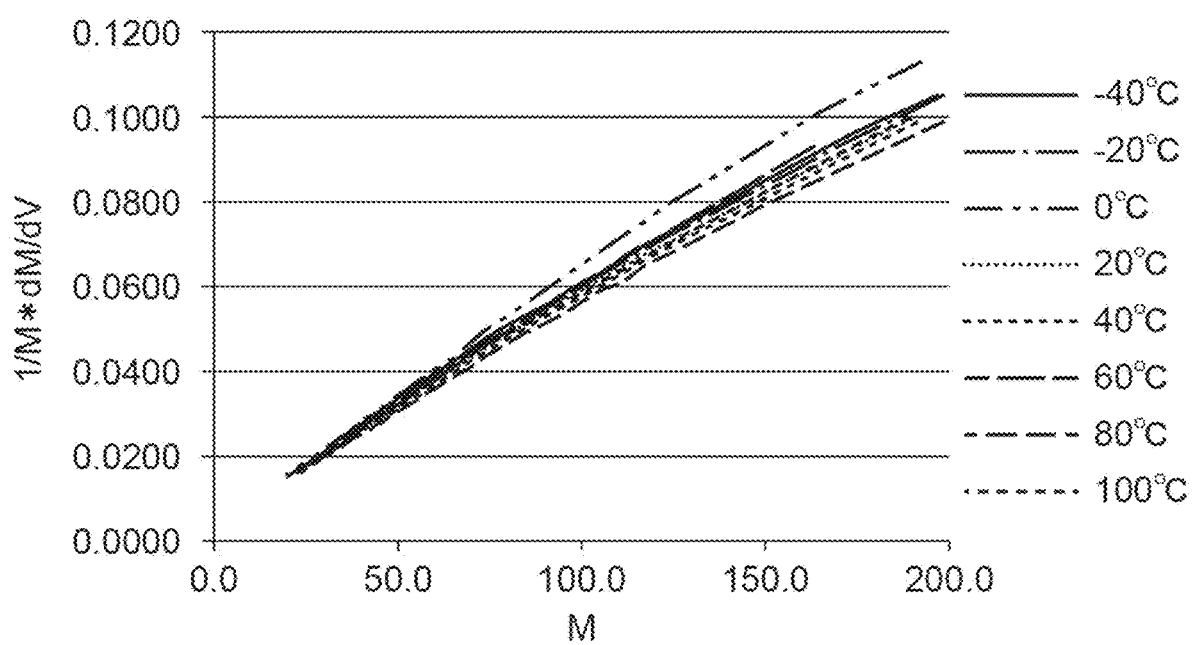
FIG. 5 is a graph of data indicating the relationship between a bias voltage applied to an APD and the gain of the APD to which the bias voltage is applied.
Figure 6:
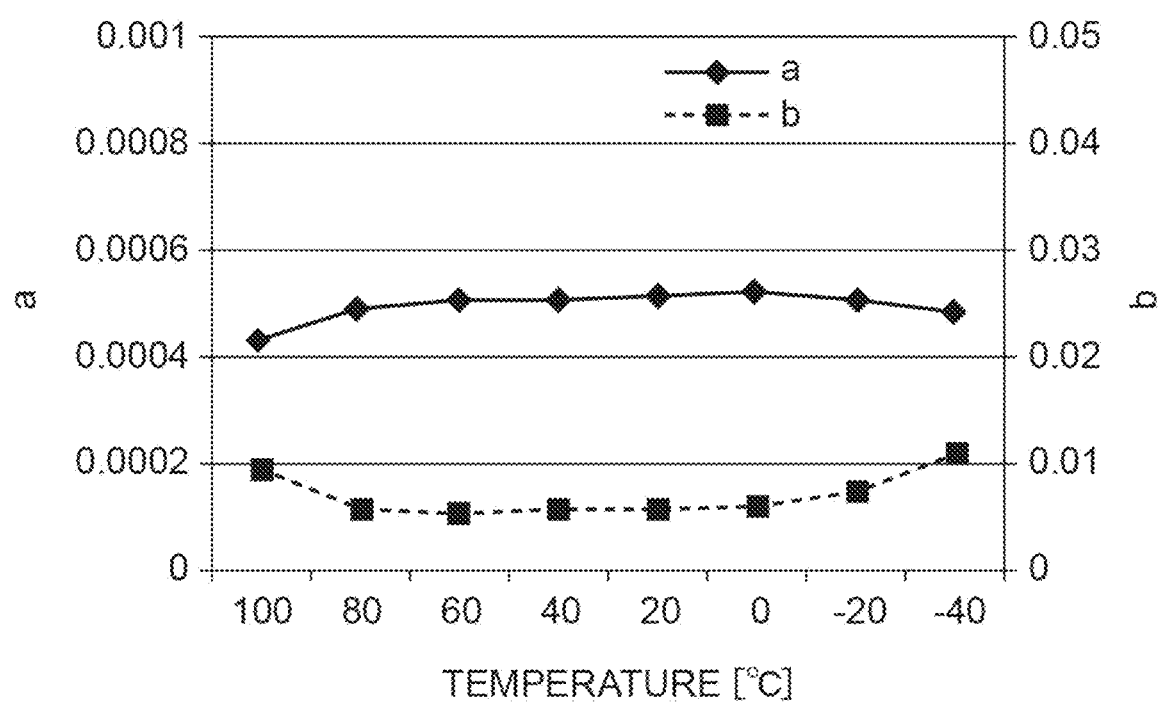
FIG. 6 is a graph illustrating the temperature dependence of the slope and intercept of the regression line.

"A" and "b" are constants. As can be seen from Equation (1), assuming that "$(1/M) \times (dM/dV_r)$" is an objective variable and "M" is an explanatory variable, for data indicating the relationship between the bias voltage and the gain in the APD, a regression line with a slope of "a" and an intercept of "b" is obtained. As illustrated in FIGS. 5 and 6, the slope "a" and the intercept "b" have extremely low temperature dependence. FIG. 5 is a graph of data indicating the relationship between the bias voltage applied to the APD and the gain of the APD to which the bias voltage is applied. In FIG. 5, the horizontal axis indicates the gain of the APD, and the vertical axis indicates the value of "$(1/M) \times (dM/dV_r)$". A plurality of lines indicate data of different ambient temperatures. Specifically, FIG. 5 illustrates data at eight ambient temperatures of 100° C., 80° C., 60° C., 40° C., 20° C., 0° C., −20° C., and −40° C. FIG. 6 is a graph illustrating the temperature dependence of the obtained slope "a" and intercept "b" of the regression line. In FIG. 6, the horizontal axis indicates the ambient temperature, and the vertical axis indicates the values of "a" and "b". The solid line indicates the data of "a", and the broken line indicates the data of "b".

Assuming that the bias voltage applied to the APD is "$V_r$", the gain of the APD to which the bias voltage is applied is "M", and the breakdown voltage of the APD is "$V_{br}$", the following equation is satisfied.

[Equation 2]

$$M = \frac{b/a}{\exp(b(V_{br} - V_r)) - 1} \quad (2)$$

Here, "a" in Equations (1) and (2) indicates the same physical quantity. "b" in Equations (1) and (2) indicates the same physical quantity.

Therefore, by substituting "a" and "b" obtained from Equation (1) into "a" and "b" in Equation (2), the value of "$(V_{br}-V_r)$" for the desired gain is uniquely calculated. "$(V_{br}-V_r)$" is a subtraction value obtained by subtracting the bias voltage applied to the APD from the breakdown voltage of the APD. That is, "$(V_{br}-V_r)$" corresponds to the difference voltage described above.

Assuming that the difference voltage is "ΔV", Equation (2) is expressed as Equation (3).

[Equation 3]

$$\Delta V = \frac{1}{b} \log\left(\frac{b/a}{M} + 1\right) \quad (3)$$

Therefore, by using Equation (4) in which the gain "M" of the APD in Equation (3) is set to a desired gain "$M_d$", "ΔV" corresponding to the desired gain can be easily calculated.

[Equation 4]

$$\Delta V = \frac{1}{b} \log\left(\frac{b/a}{M_d} + 1\right) \quad (4)$$

Specifically, data indicating the relationship between the bias voltage applied to the APD and the gain of the APD to which the bias voltage is applied is acquired at an arbitrary temperature. In the acquired data, the slope of the regression line having "$(1/M) \times (dM/dV_r)$" as an objective variable and "M" as an explanatory variable is substituted into "a" in Equation (4), the intercept of the regression line is substituted into "b" in Equation (4), and the desired gain to be set in the APD 11 is substituted into "$M_d$" in Equation (4). As a result, "ΔV" is calculated. The temperature compensation unit 15 controls the bias voltage applied to the APD 11 so that the difference voltage becomes the calculated "ΔV". Here, the acquired data indicating the relationship between the bias voltage and the gain does not have to be the data of the same APD as the APD 11 as long as the APD has the same material and structure as the APD 11.

In the present embodiment, the difference voltage corresponds to a subtraction value obtained by subtracting a voltage corresponding to the breakdown voltage of each of the temperature compensation diodes 16a, 16b, 17a, and 17b in a breakdown state from the breakdown voltage of the APD 11. In the temperature compensation unit 15, a voltage corresponding to the breakdown voltage of each of the temperature compensation diodes 16a, 16b, 17a, and 17b placed in a breakdown state is applied to the APD 11 as a bias voltage.

In the present embodiment, the APD 11, the temperature compensation diodes 16a and 16b of the group 16, and the temperature compensation diodes 17a and 17b of the group 17 have mutually different breakdown voltages. By adjusting the impurity concentration of the semiconductor layer 53 of each of the temperature compensation diodes 16a, 16b, 17a, and 17b and the impurity concentration of the semiconductor layer 53 of the APD 11, the difference voltage between the breakdown voltage of the APD 11 and the breakdown voltage of each of the temperature compensation diodes 16a, 16b, 17a, and 17b is adjusted. As a modification example of the present embodiment, the difference voltage may be adjusted depending on the circuit configuration. The difference voltage may be adjusted by applying an external voltage to the terminal 25. In the case of these modification examples, the breakdown voltage of the APD 11 and the breakdown voltages of the temperature compensation diodes 16a and 16b or the temperature compensation diodes 17a and 17b may be equal to each other. The difference voltage may be adjusted by combining these plurality of methods.

In the present embodiment, the impurity concentration of the semiconductor layer 53 of each of the temperature compensation diodes 16a, 16b, 17a, and 17b is higher than the impurity concentration of the semiconductor layer 53 of the APD 11. As a result, the breakdown voltage of the APD 11 is higher than the breakdown voltage of each of the temperature compensation diodes 16a, 16b, 17a, and 17b by "ΔV". The temperature compensation diodes 16a and 16b of the group 16 and the temperature compensation diodes 17a and 17b of the group 17 are designed to obtain mutually different gains. "ΔV" is calculated for each of the groups 16 and 17 of the temperature compensation diodes 16a, 16b, 17a, and 17b according to Equation (4), and the impurity concentration of the semiconductor layer 53 of each of the temperature compensation diodes 16a, 16b, 17a, and 17b is designed according to each calculated "ΔV". When calculating "ΔV" for each of the groups 16 and 17 of the temperature compensation diodes 16a, 16b, 17a, and 17b, the same value is substituted into "a". Similarly, when calculating "ΔV" for each of the groups 16 and 17 of the temperature compensation diodes 16a, 16b, 17a, and 17b, the same value is substituted into "b".

In the light detection device 1, since a breakdown voltage of each of the temperature compensation diodes 16a, 16b, 17a, and 17b is applied, the breakdown voltage is applied to the APD 11 as a bias voltage. In the present embodiment, one of the breakdown voltages of the plurality of temperature compensation diodes 16a, 16b, 17a, or 17b is applied to the APD 11 as a bias voltage. Which of the breakdown voltages of the temperature compensation diodes 16a and 16b and the temperature compensation diodes 17a and 17b is to be applied to the APD 11 as a bias voltage is controlled by the setting unit 40.

Next, the operation of the light detection device according to the present embodiment will be described.

In the present embodiment, the terminal 22 is connected to the semiconductor layer 54 of the P⁺ type, and the semiconductor layer 54 is connected to the semiconductor layer 55 of the P⁺ type. Therefore, the anodes of the APD 11 and the temperature compensation diodes 16a, 16b, 17a, and 17b are connected to the terminal 22 in parallel with each other. As a result, a negative potential is applied to the anodes of the APD 11 and the temperature compensation diodes 16a, 16b, 17a, and 17b by the power supply unit 4.

The circuit unit 3 causes one of the plurality of temperature compensation diodes 16a, 16b, 17a, or 17b to break down. The setting unit 40 selects a group to be operated among the plurality of groups 16 and 17 by using the switch 41. The setting unit 40 selects a group of temperature compensation diodes to apply a breakdown voltage to the APD 11 as a bias voltage, by switching ON/OFF of the switch 41. The setting unit 40 selects, among the plurality of temperature compensation diodes 16a, 16b, 17a, and 17b, a group to be used for controlling the bias voltage so that "ΔV" calculated by substituting the gain set in the APD 11 into "$M_d$" in Equation (4) becomes a difference voltage.

The breakdown voltage of the temperature compensation diode of the selected group corresponds to a potential difference between the potential applied to the terminal 25 corresponding to the temperature compensation diode and the potential applied to the terminal 22. Therefore, a potential corresponding to the breakdown voltage of the temperature compensation diode of the selected group is applied to the anode of the APD 11. As a result, a voltage corresponding to the breakdown voltage of the temperature compensation diode of the selected group is applied to the APD 11 as a bias voltage.

In the present embodiment, when operating the temperature compensation diodes 17a and 17b of the group 17, the setting unit 40 sets all the temperature compensation diodes 16a, 16b, 17a, and 17b to the state capable of being electrically energized. That is, the setting unit 40 turns on all of the switches 41 connected to the plurality of terminals 25. In this case, the temperature compensation diodes 17a and 17b of the group 17 have the lowest breakdown voltage among the temperature compensation diodes 16a, 16b, 17a, and 17b set in the state capable of being electrically energized, so that the temperature compensation diodes 17a and 17b of the group 17 operate. That is, the breakdown voltage of each of the temperature compensation diodes 17a and 17b is applied to the APD 11 as a bias voltage.

When operating the temperature compensation diodes 16a and 16b of the group 16, the setting unit 40 sets the temperature compensation diodes 16a and 16b of the group 16 to the sate capable of being electrically energized, and sets the temperature compensation diodes 17a and 17b of the group 17 to the state incapable of being electrically energized. In the present embodiment, the setting unit 40 turns on the switch 41 connected to the terminal 25 corresponding to the group 16 and turns off the switch 41 connected to the terminal 25 corresponding to the group 17. In this case, the breakdown voltage of each of the temperature compensation diodes 16a and 16b of the group 16 is applied to the APD 11 as a bias voltage.

According to the operation described above, the gain of the APD 11 is selected by the setting unit 40. In the present embodiment, the setting unit 40 sets the temperature compensation diodes 16a and 16b of the group 16 to the sate capable of being electrically energized regardless of whether or not the temperature compensation diodes 17a and 17b of the group 17 are in a state capable of being electrically energized. Hereinafter, a case where the group 17 is selected as a group of temperature compensation diodes to be operated by the setting unit 40 will be described as an example.

In the present embodiment, since a combination of the electromotive force generation unit 31 and the current limiting unit 32 is connected to the terminal 22, the breakdown voltages of the temperature compensation diodes 17a and 17b of the selected group 17 are applied to the terminal 22. In the present embodiment, the output voltage of the electromotive force generation unit 31 is equal to or higher than the operating voltage of the APD 11. In other words, the output voltage of the electromotive force generation unit 31 is equal to or higher than the upper limit of the temperature change of the breakdown voltage of each temperature compensation diode 16a, 16b, 17a, 17b. For example, the output voltage of the electromotive force generation unit 31 is 300 V or higher. The current limiting unit 32 is configured to include, for example, a current mirror circuit or a resistor.

The gain of the APD 11 can be arbitrarily set according to the breakdown voltage difference between the temperature compensation diodes 17a, 17b of the selected group 17 and the APD 11. When the gain of the APD 11 is set to an optimal multiplication factor Mopt having a high S/N ratio, the detection accuracy can be improved.

In the present embodiment, the anodes of the APD 11 and the temperature compensation diodes 16a, 16b, 17a, and 17b are integrally formed in the semiconductor layer 55. For example, when the potential applied to the terminal 25 is 0 V and the breakdown voltage of each of the temperature compensation diodes 17a and 17b of the selected group 17 is 130 V under an ambient temperature of 25° C., a potential of −130 V is applied to the anode of the APD 11. Therefore, when the breakdown voltage of the APD 11 is 150 V under an ambient temperature of 25° C., the APD 11 operates in a state in which the potential difference between the anode and the cathode is lower by 20 V than the breakdown voltage.

As described above, the APD 11 and the temperature compensation diodes 16a, 16b, 17a, and 17b have the same temperature characteristics with respect to the relationship between the gain and the bias voltage. Therefore, as long as the temperature compensation diodes 17a and 17b of the selected group 17 are in a breakdown state, the APD 11 operates while maintaining the gain of a case in which a bias voltage lower by 20 V than the breakdown voltage is applied under an ambient temperature of 25° C. In other words, in the light detection device 1, a voltage that causes the temperature compensation diodes 17a and 17b of the selected group 17 to break down is applied to the temperature compensation diodes 17a and 17b, so that temperature compensation is provided for the gain of the APD 11.

Next, the operational effects of the light detection devices in the above-described embodiment and modification examples will be described. Conventionally, when manufacturing a light detection device including an APD and a temperature compensation diode having the same temperature characteristics, it has been necessary to select and combine APDs having desired temperature characteristics with respect to the relationship between the gain and the bias voltage. For this reason, it has been difficult to reduce the cost. In this regard, in the light detection device 1, the APD 11 and the temperature compensation diodes 16a, 16b, 17a, and 17b are independently formed on the same semiconductor substrate 50. In this case, the temperature compensation diodes 16a, 16b, 17a, and 17b and the APD 11 having the same temperature characteristics over a wide temperature range with respect to the gain and the bias voltage are formed more easily and accurately than in a case where the temperature compensation diodes 16a, 16b, 17a, and 17b and the APD 11 are formed on mutually different semiconductor substrates. Therefore, temperature compensation for the gain of the APD 11 can be provided while suppressing the manufacturing cost.

The semiconductor substrate 50 includes the semiconductor region 51 of the first conductive type. Each of the APD 11 and the temperature compensation diodes 16a, 16b, 17a, and 17b includes the semiconductor layer 52 and the semiconductor layer 53. In the semiconductor substrate 50, the semiconductor layer 52 is a second conductive type. The semiconductor layer 53 is a first conductive type having a higher impurity concentration than the semiconductor region 51. The semiconductor layer 53 is located between the semiconductor region 51 and the semiconductor layer 52. As described above, the temperature compensation diodes 16a, 16b, 17a, and 17b have the same configuration as the APD 11. Therefore, it is possible to easily form the temperature compensation diodes 16a, 16b, 17a, and 17b whose temperature characteristics with respect to the gain and the bias voltage are very similar to that of the APD 11.

In the semiconductor substrate 50, the impurity concentration in the semiconductor layer 53 of each of the temperature compensation diodes 16a, 16b, 17a, and 17b is higher than the impurity concentration in the semiconductor layer 53 of the APD 11. In this case, in the light detection device 1, for example, the breakdown voltage of the APD 11 is higher than the breakdown voltage of each of the temperature compensation diodes 16a, 16b, 17a, and 17b. As a result, temperature compensation for the gain of the APD 11 arranged to operate in linear mode is provided. In addition, when the APD 11 of the semiconductor substrate 50 arranged to operate in Geiger mode, the semiconductor substrate 50 is configured such that the impurity concentration in the semiconductor layer 53 of each of the temperature compensation diodes 16a, 16b, 17a, and 17b is lower than the impurity concentration in the semiconductor layer 53 of the APD 11. In this case, in the light detection device 1, for example, the breakdown voltage of the APD 11 is lower than the breakdown voltages of the temperature compensation diodes 16a, 16b, 17a, and 17b.

In the light detection device 1, the difference voltage to obtain the desired gain is determined by substituting the slope of the regression line having "$(1/M) \times (dM/dV_r)$" as an objective variable and "M" as an explanatory variable into "a" in Equation (4) and substituting the intercept of the regression line into "b" in Equation (4). Therefore, a desired gain can be obtained very easily without strictly considering the ambient temperature.

The temperature compensation unit 15 includes the temperature compensation diodes 16a, 16b, 17a, and 17b. The temperature compensation unit 15 applies a voltage corresponding to the breakdown voltage, which is applied to any one of the temperature compensation diodes 16a, 16b, 17a, and 17b, to the APD 11 as a bias voltage. For example, when the temperature compensation diode 17a is in a breakdown state, the difference voltage corresponds to a subtraction value obtained by subtracting a voltage corresponding to the breakdown voltage of the temperature compensation diode 17a from the breakdown voltage of the APD 11. Therefore, it is possible to derive "ΔV" to obtain the desired gain and design the impurity concentrations of the APD 11 and the temperature compensation diodes 16a, 16b, 17a, and 17b so that the subtraction value becomes "ΔV".

The light detection device 1 includes the setting unit 40 and the wiring unit 21. The setting unit 40 sets the temperature compensation unit 15 according to the gain to be set in the APD 11. The wiring unit 21 electrically connects the temperature compensation unit 15 and the APD 11 to each other. The plurality of temperature compensation diodes 16a, 16b, 17a, and 17b have mutually different breakdown voltages. The wiring unit 21 applies, to the APD 11 as a bias voltage, a voltage corresponding to the breakdown voltage of each of the temperature compensation diodes 16a, 16b, 17a, and 17b. The setting unit 40 sets a temperature compensation diode to be used for controlling the bias voltage among the plurality of temperature compensation diodes 16a, 16b, 17a, and 17b so that "ΔV" calculated by substituting the gain to be set in the APD 11 into "$M_d$" in Equation (4) becomes a difference voltage. As a result, a temperature compensation diode to be used for controlling the bias voltage among the plurality of temperature compensation diodes 16a, 16b, 17a, and 17b is set by the setting unit 40. Therefore, a gain desired according to the situation can be obtained very easily without strictly considering the ambient temperature. In other words, it is possible to easily switch a desired gain and obtain the desired gain in a stable manner with respect to temperature.

The circuit unit 3 electrically connects the APD 11 and the temperature compensation diodes 16a, 16b, 17a, and 17b to the terminal 22 in parallel with each other. In this configuration, when any one of the plurality of temperature compensation diodes 16a, 16b, 17a, and 17b is in a breakdown state, the breakdown voltage of the temperature compensation diode in the breakdown state is applied to the APD 11 as a bias voltage. As a result, the difference voltage between the breakdown voltage of the APD 11 and the bias voltage applied to the APD 11 is set, and the APD 11 has a gain corresponding to the difference voltage. Therefore, according to a temperature compensation diode that breaks down, a gain desired according to the situation can be obtained in a stable manner with respect to temperature in the APD 11.

The circuit unit 3 includes at least one switch 41. The switches are electrically connected to the corresponding temperature compensation diodes 16a, 16b, 17a, and 17b. The switches 41 switch between a state capable of electrically energizing the corresponding temperature compensation diodes 16a, 16b, 17a, and 17b and a state incapable of electrically energizing the corresponding temperature compensation diodes 16a, 16b, 17a, and 17b. The temperature compensation diodes 16a and 16b have higher breakdown voltages than the temperature compensation diodes 17a and 17b. The switches 41 are electrically connected to the temperature compensation diodes 17a and 17b. In this case, when the temperature compensation diodes 17a and 17b are set to a state capable of being electrically energized by the switches 41, the temperature compensation diodes 17a and 17b preferentially break down even if the temperature compensation diodes 16a and 16b are in a state capable of being electrically energized. In this manner, it is possible to switch a gain desired according to the situation in the APD 11 with simple control.

At least one switch 41 is connected to the corresponding terminal 25. A high voltage is applied between the electrode 29a of each of the temperature compensation diodes 16a, 16b, 17a, and 17b and the APD 11. Therefore, a control in a case where the switch 41 is electrically connected to the electrode 29b through the terminal 25 can be easier than that in a case where the switch 41 is disposed between the electrode 29a and the APD 11.

The circuit unit 3 is configured to set the temperature compensation diodes 16a and 16b into a state capable of being electrically energized regardless of whether or not to be capable electrically energizing the temperature compensation diodes 17a and 17b. In this case, even if all of the temperature compensation diodes 17a and 17b are damaged, the temperature compensation diodes 16a and 16b break down. Therefore, the flow of a large current to the APD 11 is prevented, and the failure of the light detection device 1 is prevented.

The temperature detection region 72 and the temperature detection region 73 where the plurality of temperature compensation diodes 16a, 16b, 17a, and 17b are provided are located with the light detection region 71 interposed therebetween. Therefore, even if the temperature rises locally in the vicinity of the temperature detection region 72, the temperature compensation diodes 16b and 17b provided in the temperature detection region 73 can operate normally. That is, the light detection device 1 has improved resistance to local temperature changes.

The temperature compensation unit 15 includes, as a plurality of temperature compensation diodes, the temperature compensation diodes 16a and 16b having the same breakdown voltage. The temperature compensation diode 16a is provided in the temperature detection region 72. The temperature compensation diode 16b is provided in the temperature detection region 73. Therefore, even if the temperature is locally high in the vicinity of the temperature detection region 72 and the temperature compensation diode 16a does not function normally, the temperature compensation diode 16b provided in the temperature detection region 73 can operate normally. Therefore, a stable bias voltage can be applied to the APD 11 even if the temperature changes locally. For this reason, a desired gain can be stably obtained in the APD 11.

The temperature compensation unit 15 includes, as a plurality of temperature compensation diodes, the temperature compensation diodes 17a and 17b having a breakdown voltage different from that of the temperature compensation diodes 16a and 16b. The temperature compensation diodes 17a and 17b have the same breakdown voltage. The temperature compensation diode 17a is provided in the temperature detection region 72. The temperature compensation diode 17b is provided in the temperature detection region 73. In this case, the voltage applied to the APD 11 as a bias voltage can be switched between the breakdown voltage of the temperature compensation diodes 17a and 17b and the breakdown voltage of the temperature compensation diodes 16a and 16b. For this reason, in the APD 11, even if the temperature is locally high in the vicinity of the temperature detection region 72 and the temperature compensation diodes 16a and 17a do not function normally, the temperature compensation diodes 16b and 17b provided in the temperature detection region 73 can operate normally. Therefore, even if the temperature changes locally, a desired bias voltage that is stable can be applied to the APD 11. For this reason, a gain desired according to the situation can be stably obtained in the APD 11.

The light detection unit 20 includes a plurality of APDs 11 as at least one APD 11. A plurality of APDs 11 are provided in the light detection region 71. In this case, a temperature difference is likely to occur around the light detection region 71 where the APD 11 is provided. In the light detection device 1, since the temperature detection region 72 and the temperature detection region 73 are located with the light detection region 71 interposed therebetween, the resistance to local temperature changes is improved.

Figure 7:
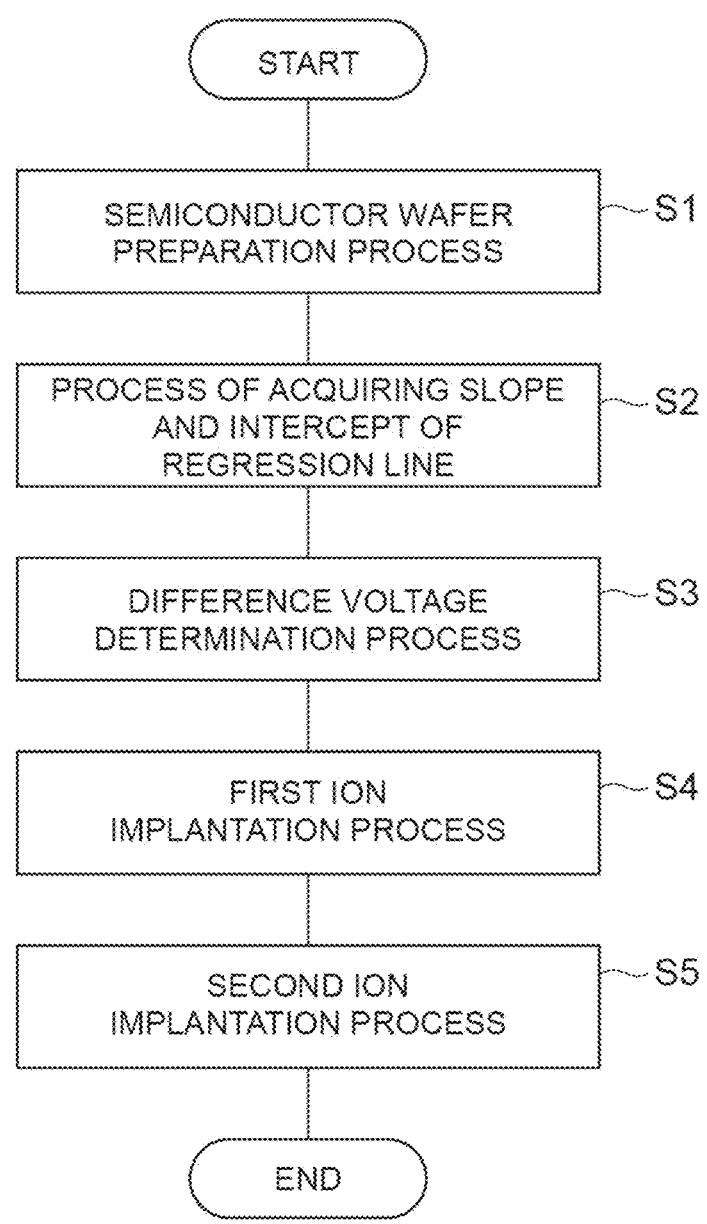
FIG. 7 is a flowchart illustrating a semiconductor substrate manufacturing method.

Next, an example of a method for manufacturing a light detection device will be described with reference to FIG. 7. FIG. 7 is a flowchart illustrating a method for manufacturing the semiconductor substrate 50 in the light detection device 1.

First, a semiconductor wafer is prepared (process S1). The semiconductor wafer is a substrate before being processed as the semiconductor substrate 50, and has main surfaces 50a and 50b facing each other. The semiconductor wafer has a first conductive type semiconductor region corresponding to the semiconductor region 51. The semiconductor region is provided on the main surface 50a side of the semiconductor wafer, and forms the entire main surface 50a. For example, the semiconductor region of the semiconductor wafer is P⁻ type. In the present embodiment, the semiconductor layer 55 of the first conductive type, which has an impurity concentration higher than the semiconductor region of the semiconductor wafer, is formed in the semiconductor wafer by adding impurities from the main surface 50b side. For example, the semiconductor layer 55 is P⁺ type.

Subsequently, the difference voltage between the breakdown voltage of the APD 11 and the bias voltage applied to the APD 11 is determined. The determination method is as follows.

First, the slope and intercept of the regression line, which has "$(1/M) \times (dM/dV_r)$" as an objective variable and "M" as an explanatory variable in the data indicating the correlation between the bias voltage applied to the APD and the gain of the APD are obtained (process S2). Here, "$V_r$" is a bias voltage applied to the APD, and "M" is the gain of the APD to which the bias voltage is applied. The above data used in process S2 corresponds to a separate body having the same material and structure as the APD 11.

Then, the difference voltage to obtain the desired gain is determined by using the result obtained in process S2 and Equation (4) (process S3). The above difference voltage corresponds to "ΔV" calculated by substituting the obtained slope into "a" in Equation (4), substituting the obtained intercept into "b" in Equation (4), and substituting the desired gain to be set in the APD 11 into "$M_d$" in Equation (4). In the present embodiment, a plurality of values different from each other are determined as a gain to be set in the APD 11, and a plurality of difference voltages described above are determined for these values. A plurality of "ΔV" calculated by substituting a plurality of values different from each other into "$M_d$" in Equation (4) are determined as the difference voltages corresponding to the plurality of values.

Subsequently, as first ion implantation process (process S4), impurity ions are implanted to the main surface 50a side using an ion implantation method to add impurities, forming the second conductive type semiconductor layer 52 and the first conductive type semiconductor layers 53 and 54. For example, the semiconductor layer 52 is $N^+$ type, the semiconductor layer 53 is P type, and the semiconductor layer 54 is $P^+$ type. In the present embodiment, the semiconductor layer 52 is formed by implanting second conductive type impurity ions into different portions spaced apart from each other in one ion implantation process. The semiconductor layer 53 is formed by implanting first conductive type impurity ions after the semiconductor layer 52 is formed. The semiconductor layer 53 may be formed by implanting first conductive type impurity ions before the semiconductor layer 52 is formed.

The semiconductor layers 52 and 53 are formed at locations overlapping each other when viewed from the direction perpendicular to the main surface 50a. The semiconductor layer 53 is formed by implanting first conductive type impurities at a location deeper than the semiconductor layer 52 when viewed from the main surface 50a side. The semiconductor layers 52 and 53 are formed at a plurality of portions spaced apart from each other when viewed from the direction perpendicular to the main surface 50a, in a region serving as one semiconductor substrate 50. The plurality of portions include a portion where the APD 11 is disposed and a portion where each of the temperature compensation diodes 16a, 16b, 17a, and 17b is disposed. In the first ion implantation process, second conductive type impurities are added to each portion so that the impurity concentration of the semiconductor layer 52 is the same. Similarly, first conductive type impurities are added to each portion so that the impurity concentration of the semiconductor layer 53 is the same.

Subsequently, as second ion implantation process (process S5), impurities are further added only to the semiconductor layer 53 in some of the above-described plurality of portions by using an ion implantation method. In the present embodiment, the first conductive type impurities are further implanted into the semiconductor layer 53 only in a portion where each of the temperature compensation diodes 16a, 16b, 17a, and 17b is disposed. Accordingly, in the light detection device 1, the impurity concentration in the semiconductor layer 53 of each of the temperature compensation diodes 16a, 16b, 17a, and 17b is higher than the impurity concentration in the semiconductor layer 53 of the APD 11. In this case, the light detection device 1 is configured such that the breakdown voltage of the APD 11 is higher than the breakdown voltage of each of the temperature compensation diodes 16a, 16b, 17a, and 17b.

The amount of the first conductive type impurities implanted into the semiconductor layer 53 of each of the temperature compensation diodes 16a, 16b, 17a, and 17b in processes S4 and S5 depends on the difference voltage determined in process S3. In the present embodiment, the amount of the first conductive type impurities implanted into the semiconductor layer 53 of each of the temperature compensation diodes 17a and 17b is larger than the amount of the first conductive type impurities implanted into the semiconductor layer 53 of each of the temperature compensation diodes 16a and 16b. Therefore, the breakdown voltages of the temperature compensation diodes 16a and 16b are configured to be larger than the breakdown voltages of the temperature compensation diodes 17a and 17b.

In the second ion implantation process, the first conductive type impurities may be further implanted into the semiconductor layer 53 only in a portion where the APD 11 is disposed, not in a portion where each of the temperature compensation diodes 16a, 16b, 17a, and 17b is disposed. In this case, in the light detection device 1, the impurity concentration in the semiconductor layer 53 of each of the temperature compensation diodes 16a, 16b, 17a, and 17b is lower than the impurity concentration in the semiconductor layer 53 of the APD 11. In the light detection device 1 in this case, the breakdown voltage of the APD 11 is configured to be lower than the breakdown voltage of each of the temperature compensation diodes 16a, 16b, 17a, and 17b.

By the processes described above, the semiconductor substrate 50 of the light detection device 1 is formed. Processes S2 and S3 may be performed before process S1 or after process S4. In the present embodiment, the semiconductor layers 52, 53, and 54 are formed from the state in which the semiconductor layer 55 has already been formed. However, the semiconductor layer 55 may be formed after the semiconductor layers 52, 53, and 54 are formed.

In the manufacturing method described above, the semiconductor layer 52 and the semiconductor layer 53 are formed in each portion by implanting ions into a plurality of different portions. Thereafter, ions are further implanted into the semiconductor layer 53 in some of the portions. Therefore, the plurality of temperature compensation diodes 16a, 16b, 17a, and 17b and the APD 11 each of which is set to the desired breakdown voltage can be easily manufactured while having the same temperature characteristics with respect to the gain and the bias voltage. In this case, the gain of the APD 11 can be arbitrarily set according to the difference voltage between the breakdown voltage of each of the temperature compensation diodes 16a, 16b, 17a, and 17b and the breakdown voltage of the APD 11. Therefore, when each of the temperature compensation diodes 16a, 16b, 17a, and 17b and the APD 11 is set to the desired breakdown voltage, the detection accuracy can be improved. For example, when the gain of the APD 11 is set to the optimal multiplication factor Mopt having a high S/N ratio according to the above difference voltage, the detection accuracy can be improved. Thus, in the manufacturing method described above, temperature compensation for the gain of the APD 11 is provided while suppressing the manufacturing cost, and the detection accuracy can be improved.

In the difference voltage determination method described above, the slope and intercept of the regression line, which has "$(1/M) \times (dM/dV_r)$" as an objective variable and "M" as an explanatory variable, are obtained. By substituting the obtained slope into "a" in Equation (4) and substituting the obtained intercept into "b" in Equation (4), the difference voltage to obtain the desired gain is determined. Therefore, the difference voltage to obtain the desired gain is determined very easily without strictly considering the ambient temperature.

In the determination method described above, a plurality of "ΔV" calculated by each substituting a plurality of different values as gains to be set in the APD 11 into "$M_d$" in Equation (4) are determined as difference voltages corresponding to the plurality of values. Therefore, the plurality of difference voltages corresponding to the plurality of values are determined very easily without strictly considering the ambient temperature.

While the embodiment of the present invention and the modification examples have been described above, the present invention is not necessarily limited to the embodiment and the modification examples described above, and various changes can be made without departing from the scope of the present invention.

In the present embodiment, the configuration in which the so-called reach-through type APD 11 is arranged to operate in linear mode has been described. The light detection device 1 may have a configuration in which the reverse type APD 11 is arranged to operate in linear mode. The light detection device 1 may have a configuration in which the reach-through type APD 11 is arranged to operate in Geiger mode. The light detection device 1 may have a configuration in which the reverse type APD 11 is arranged to operate in Geiger mode. In the configuration in which the APD 11 is arranged to operate in Geiger mode, the semiconductor substrate 50 is configured such that a quenching resistor is connected to the APD 11 and the impurity concentration of the semiconductor layer 53 of each of the temperature compensation diodes 16a, 16b, 17a, and 17b is lower than the impurity concentration of the semiconductor layer 53 of the APD 11.

In the present embodiment, the light detection device 1 including the electromotive force generation unit 31, the current limiting unit 32, the bias voltage stabilization unit 33, and the setting unit 40 has been described. However, the light detection device according to the present embodiment may have a configuration in which at least one of the electromotive force generation unit 31, the current limiting unit 32, the bias voltage stabilization unit 33, or the setting unit 40 is not included. In this case, an external device connected to the light detection device may function as the electromotive force generation unit 31, the current limiting unit 32, the bias voltage stabilization unit 33, or the setting unit 40. The light detection device 1 may include a signal reading circuit (not illustrated).

In the present embodiment, the configuration has been described in which the switch 41 is connected to the terminal 25 of the light detection unit 20 and the switch 41 is controlled by the setting unit 40. However, the switch 41 may be disposed inside the light detection unit 20.

In the present embodiment, the terminals 22, 23, 24, and 25 have been described as pad electrodes. However, the terminals 22, 23, 24, and 25 may be configured by the semiconductor in the semiconductor substrate 50.

The switch 41 for switching the electrical connection between each of the temperature compensation diodes 16a, 16b, 17a, and 17b and the APD 11 may be disposed in the wiring unit 21, and ON/OFF of the switch 41 in the wiring unit 21 may be controlled by the setting unit 40. Also in this case, the setting unit 40 controls the bias voltage applied to the APD 11. Since a high voltage is applied between the APD 11 and each of the temperature compensation diodes 16a, 16b, 17a, and 17b, the switch 41 connected to the terminal 25 is controlled more easily than in a case where the switch disposed in the wiring unit 21 is controlled.

The temperature compensation unit 15 may include a plurality of temperature compensation diodes having the same breakdown voltage. According to this configuration, even if a part of the temperature compensation diode is damaged or a local temperature change occurs in the vicinity where a part of the temperature compensation diode is disposed, the normal operation of the light detection device 1 can be provided.

Figure 8:
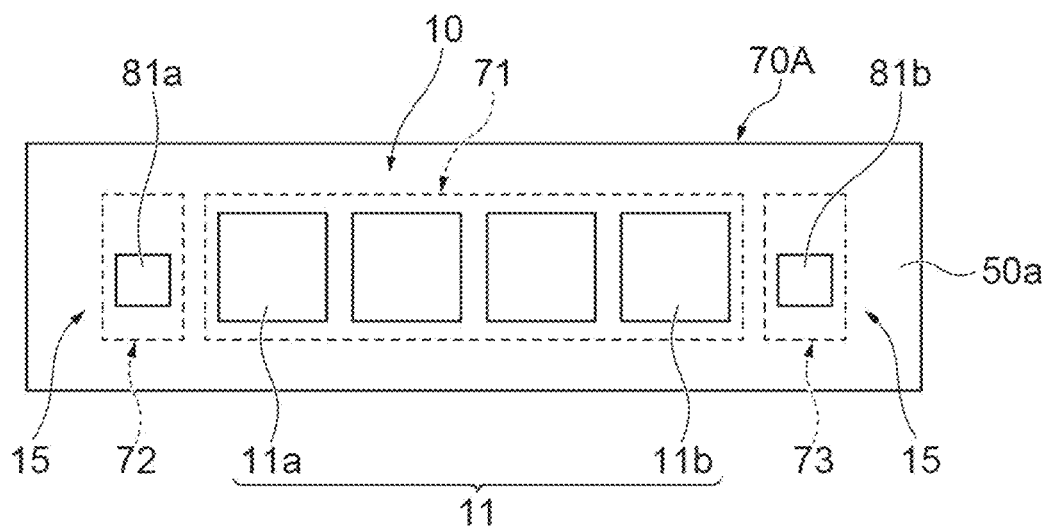
FIG. 8 is a schematic plan view of a semiconductor substrate according to a modification example of the present embodiment.
Figure 9:
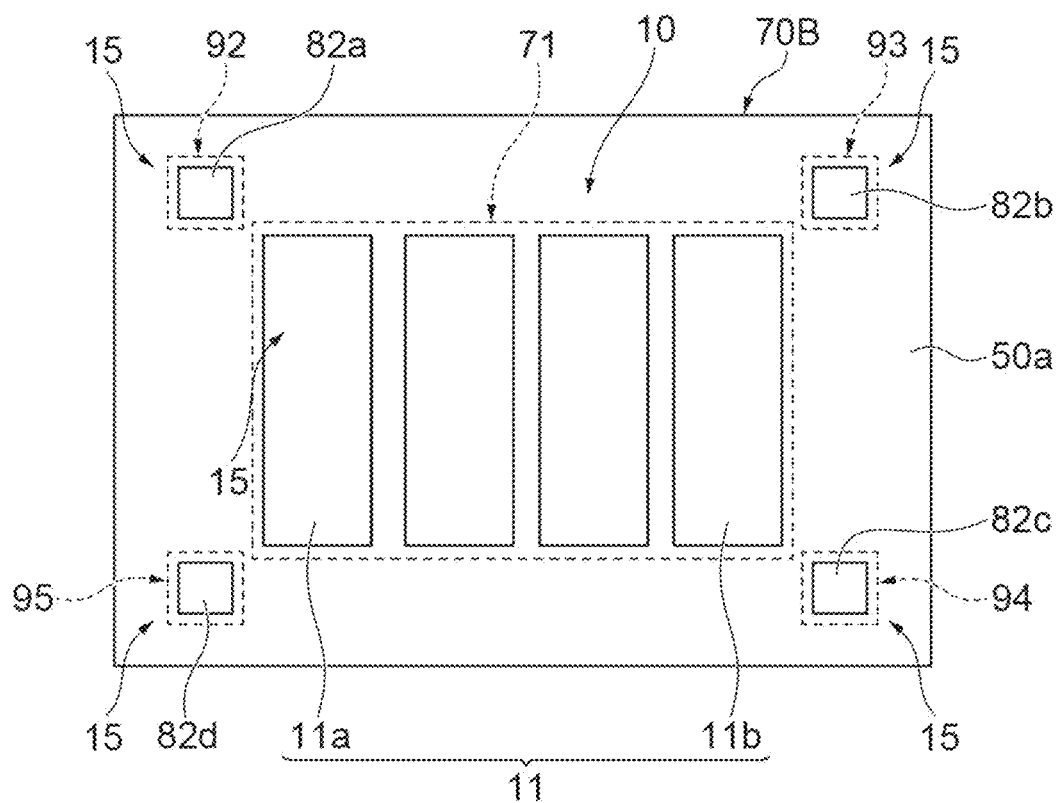
FIG. 9 is a schematic plan view of a semiconductor substrate according to a modification example of the present embodiment.
Figure 10:
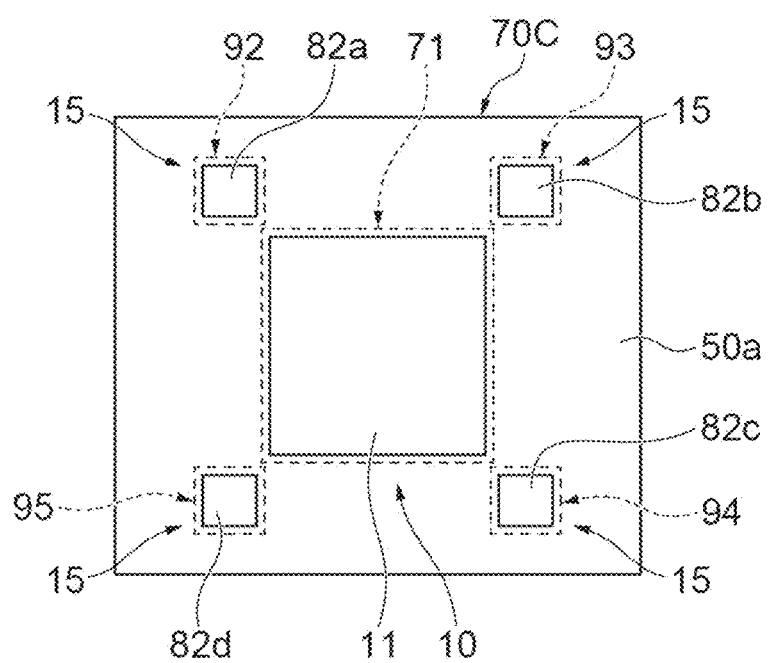
FIG. 10 is a schematic plan view of a semiconductor substrate according to a modification example of the present embodiment.
Figure 11:
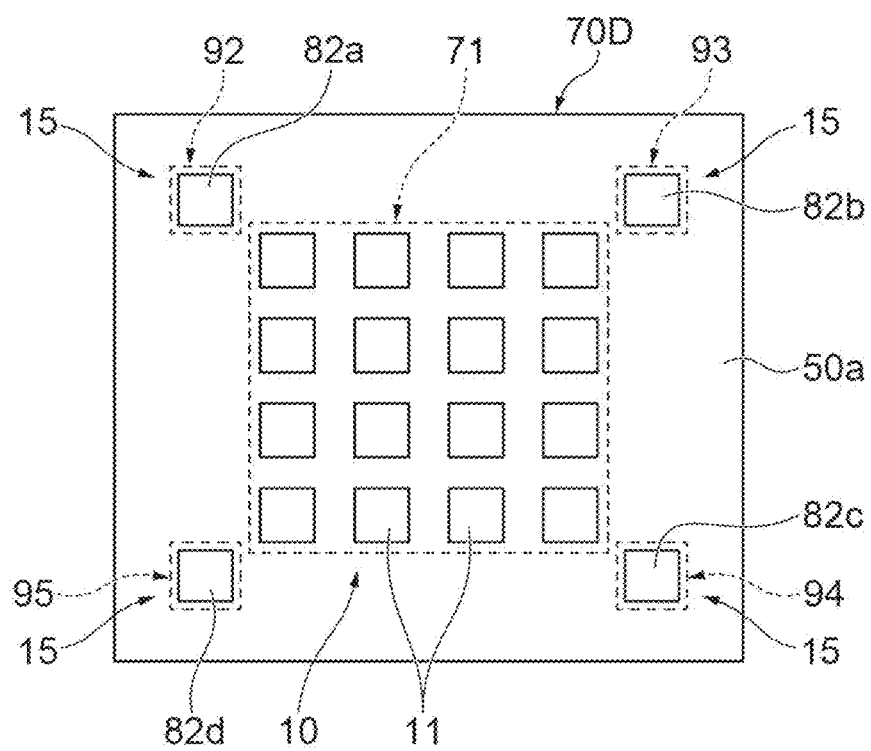
FIG. 11 is a schematic plan view of a semiconductor substrate according to a modification example of the present embodiment.
Figure 12:
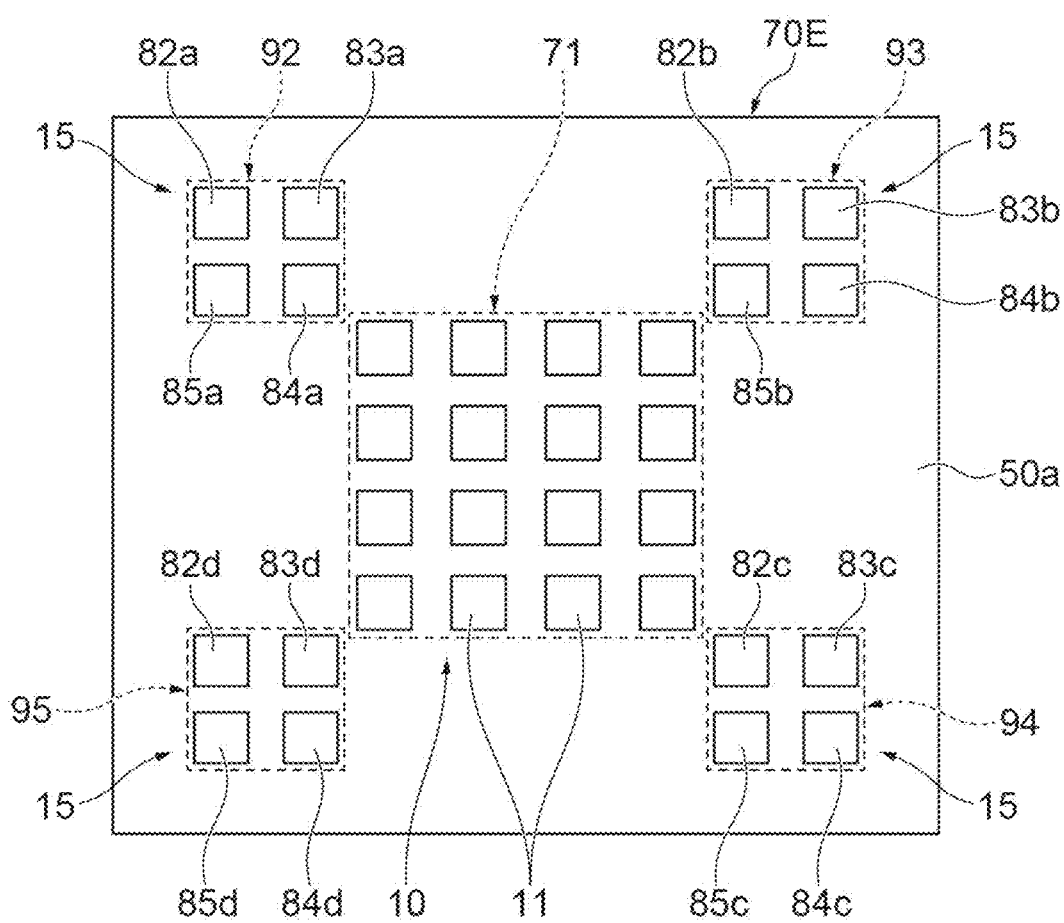
FIG. 12 is a schematic plan view of a semiconductor substrate according to a modification example of the present embodiment.

Next, a light detection device according to a modification example of the present embodiment will be described with reference to FIGS. 8 to 12. FIG. 8 is a schematic plan view of a semiconductor substrate 70A according to a modification example of the present embodiment. FIG. 9 is a schematic plan view of a semiconductor substrate 70B according to a modification example of the present embodiment. FIG. 10 is a schematic plan view of a semiconductor substrate 70C according to a modification example of the present embodiment. FIG. 11 is a schematic plan view of a semiconductor substrate 70D according to a modification example of the present embodiment. FIG. 12 is a schematic plan view of a semiconductor substrate 70E according to a modification example of the present embodiment. Each of the semiconductor substrates 70A, 70B, 70C, 70D, and 70E corresponds to the semiconductor substrate 50 of the embodiment described above. These modification examples are generally similar to or the same as the embodiment described above. These modification examples are different from the above-described embodiment in terms of the positional relationship between a plurality of temperature compensation diodes in the temperature compensation unit 15 and the APD 11 included in the light receiving unit 10. Hereinafter, the differences from the above-described embodiment will be mainly described.

The modification example illustrated in FIG. 8 is generally similar to or the same as the embodiment described above. This modification example is different from the above-described embodiment in terms of the number of temperature compensation diodes in the temperature compensation unit 15 and the number of APDs 11 included in the light receiving unit 10. Hereinafter, the differences from the above-described embodiment will be mainly described.

In the modification example illustrated in FIG. 8, the light receiving unit 10 includes four APDs 11. The temperature compensation unit 15 includes temperature compensation diodes 81a and 81b. The temperature compensation diodes 81a and 81b have the same breakdown voltage. That is, in this modification example, the plurality of temperature compensation diodes of the temperature compensation unit 15 belong to only one group with the same breakdown voltage. The temperature compensation diode 81a is a first temperature compensation diode, and the temperature compensation diode 81b is a second temperature compensation diode.

As illustrated in FIG. 8, a plurality of temperature compensation diodes 81a and 81b are provided in the temperature detection regions 72 and 73. The temperature compensation diode 81a is provided in the temperature detection region 72. The temperature compensation diode 81b is provided in the temperature detection region 73. In this modification example, the temperature compensation diodes 81a and 81b are arranged in the arrangement direction of the plurality of APDs 11.

The modification example illustrated in FIG. 9 is generally similar to or the same as the modification example illustrated in FIG. 8. This modification example is different from the modification example illustrated in FIG. 8 in terms of the number of temperature compensation diodes in the temperature compensation unit 15 and the positions thereof and the shape of the APD 11 included in the light receiving unit 10. Hereinafter, the differences from the modification example illustrated in FIG. 8 will be mainly described.

In the modification example illustrated in FIG. 9, the light detection unit 20 has a light detection region 71 where the light receiving unit 10 is provided and a plurality of temperature detection regions 92, 93, 94, and 95 where the temperature compensation units 15 are provided. The temperature detection regions 92, 93, 94, and 95 are located around the light detection region 71. The temperature detection regions 92, 93, 94, and 95 are located on all sides of the light detection region 71. The light detection region 71 is interposed between the temperature detection region 92 and the temperature detection region 94. In other words, the light detection region 71 is located between the temperature detection region 92 and the temperature detection region 94. The light detection region 71 is interposed between the temperature detection region 93 and the temperature detection region 95. In other words, the light detection region 71 is located between the temperature detection region 93 and the temperature detection region 95.

In the modification example illustrated in FIG. 9, the light receiving unit 10 includes four APDs 11. The four APDs 11 are provided in the light detection region 71. In the present embodiment, the four APDs 11 are arranged in a row in the light detection region 71. The APD 11a is located at one end of the row, and the APD 11b is located at the other end. Each of the four APDs 11 has a shape extending in a direction crossing the arrangement direction of the four APDs 11 when viewed from the direction perpendicular to the main surface 50a. Each APD 11 has a rectangular shape having the above-described arrangement direction as a short side when viewed from the direction perpendicular to the main surface 50a. In the present embodiment, the temperature detection regions 92 and 95 are closest to the APD 11a among the plurality of APDs 11. The temperature detection regions 93 and 94 are closest to the APD 11b among the plurality of APDs 11.

As illustrated in FIG. 9, the temperature compensation unit 15 includes temperature compensation diodes 82a, 82b, 82c, and 82d. The temperature compensation diodes 82a, 82b, 82c, and 82d have the same breakdown voltage. The temperature compensation diodes 82a, 82b, 82c, and 82d are provided in the temperature detection regions 92, 93, 94, and 95, respectively. In the present embodiment, the temperature compensation diode 82a is provided in the temperature detection region 92. The temperature compensation diode 82b is provided in the temperature detection region 93. The temperature compensation diode 82c is provided in the temperature detection region 94. The temperature compensation diode 82d is provided in the temperature detection region 95.

This modification example illustrated in FIG. 10 is generally similar to or the same as the modification example illustrated in FIG. 9. This modification example is different from the modification example illustrated in FIG. 9 in terms of the number of APDs 11 included in the light receiving unit 10 and the shapes thereof. Hereinafter, the differences from the modification example illustrated in FIG. 9 will be mainly described.

In the modification example illustrated in FIG. 10, the light receiving unit 10 includes one square APD 11. This one square APD 11 is provided in the light detection region 71. The temperature detection regions 92, 93, 94, and 95 are disposed close to the four corners of the square APD 11. That is, the temperature compensation diodes 82a, 82b, 82c, and 82d are disposed close to the four corners of the square APD 11. Each side of the APD 11 in the modification example illustrated in FIG. 10 is longer than the short side of the APD 11 in the modification example illustrated in FIG. 9. Each side of the APD 11 in the modification example illustrated in FIG. 10 is 10 times or more each side of the temperature compensation diodes 82a, 82b, 82c, and 82d. One APD 11 is provided in the light detection region 71.

The modification example illustrated in FIG. 11 is generally similar to or the same as the modification examples illustrated in FIGS. 9 and 10. This modification example is different from the modification examples illustrated in FIGS. 9 and 10 in terms of the number of APDs 11 included in the light receiving unit 10 and the shapes thereof. Hereinafter, the differences from the modification examples illustrated in FIGS. 9 and 10 will be mainly described.

In the modification example illustrated in FIG. 11, the light receiving unit 10 includes a plurality of APDs 11 arranged in a matrix when viewed from the direction perpendicular to the main surface 50a. In this modification example, the light receiving unit 10 includes 16 APDs 11 arranged in four rows and four columns. These 16 APDs 11 are arranged in the light detection region 71. The temperature detection regions 92, 93, 94, and 95 are disposed close to the APDs 11 located at the four corners among the APDs 11 arranged in a matrix. That is, the temperature compensation diodes 82a, 82b, 82c, and 82d are disposed close to the APDs 11 located at the four corners among the APDs 11 arranged in a matrix.

The modification example illustrated in FIG. 12 is generally similar to or the same as the modification example illustrated in FIG. 12. This modification example is different from the modification example illustrated in FIG. 11 in terms of the number of temperature compensation diodes included in each of the temperature detection regions 92, 93, 94, and 95 and the positions thereof. Hereinafter, the differences from the modification example illustrated in FIG. 11 will be mainly described.

In the modification example illustrated in FIG. 12, a plurality of temperature compensation diodes having mutually different breakdown voltages are provided in a plurality of temperature detection regions, respectively, as in the embodiment illustrated in FIG. 4. In this modification example, four temperature compensation diodes are provided in the temperature detection regions 92, 93, 94, and 95, respectively. The four temperature compensation diodes have mutually different breakdown voltages. That is, in this modification example, the plurality of temperature compensation diodes of the temperature compensation unit 15 are divided into four groups of temperature compensation diodes having mutually different breakdown voltages. In each of the temperature detection regions 92, 93, 94, and 95, four temperature compensation diodes are arranged in a matrix of two rows and two columns.

In this modification example, temperature compensation diodes 82a, 83a, 84a, and 85a having mutually different breakdown voltages are provided in the temperature detection region 92. Temperature compensation diodes 82b, 83b, 84b, and 85b having mutually different breakdown voltages are provided in the temperature detection region 93. Temperature compensation diodes 82c, 83c, 84c, and 85c having mutually different breakdown voltages are provided in the temperature detection region 94. Temperature compensation diodes 82d, 83d, 84d, and 85d having mutually different breakdown voltages are provided in the temperature detection region 95. As described in the modification example illustrated in FIG. 9, the temperature compensation diodes 82a, 82b, 82c, and 82d have the same breakdown voltage. Similarly, the temperature compensation diodes 83a, 83b, 83c, and 83d have the same breakdown voltage. The temperature compensation diodes 84a, 84b, 84c, and 84d have the same breakdown voltage. The temperature compensation diodes 85a, 85b, 85c, and 85d have the same breakdown voltage.

REFERENCE SIGNS LIST

1: light detection device, 11, 11a, 11b: APD, 15: temperature compensation unit, 16a, 16b, 17a, 17b, 81a, 81b, 82a, 82b, 82c, 82d, 83a, 84a, 85a, 83b, 84b, 85b, 83c, 84c, 85c, 83d, 84d, 85d: temperature compensation diode, 20: light detection unit, 22: terminal, 40: setting unit, 71: light detection region, 72, 73, 92, 93, 94, 95: temperature detection region.

The invention claimed is:

1. A light detection device, comprising:
a light detection unit including at least one avalanche photodiode, a plurality of temperature compensation diodes configured to provide temperature compensation for a gain of the at least one avalanche photodiode, and a terminal electrically connecting the at least one avalanche photodiode and the plurality of temperature compensation diodes in parallel with each other,
wherein the light detection unit has a light detection region in which the at least one avalanche photodiode is provided, a first temperature detection region which is located around the light detection region and in which at least one of the plurality of temperature compensation diodes is provided, and a second temperature detection region which is located around the light detection region and in which the rest of the plurality of temperature compensation diodes excluding the at least one temperature compensation diode is provided, and
the light detection region is interposed between the first temperature detection region and the second temperature detection region.

2. The light detection device according to claim 1,
wherein the plurality of temperature compensation diodes include first and second temperature compensation diodes having a common breakdown voltage,
the first temperature compensation diode is provided in the first temperature detection region, and
the second temperature compensation diode is provided in the second temperature detection region.

3. The light detection device according to claim 2,
wherein the plurality of temperature compensation diodes include third and fourth temperature compensation diodes having breakdown voltages different from those of the first and second temperature compensation diodes,
the third and fourth temperature compensation diodes have a common breakdown voltage,
the third temperature compensation diode is provided in the first temperature detection region, and
the fourth temperature compensation diode is provided in the second temperature detection region.

4. The light detection device according to claim 1,
wherein the light detection unit includes a plurality of avalanche photodiodes as the at least one avalanche photodiode, and
the plurality of avalanche photodiodes is provided in the light detection region.

* * * * *